(12) United States Patent
Baba

(10) Patent No.: US 8,302,869 B2
(45) Date of Patent: Nov. 6, 2012

(54) RFID TAG AND RFID TAG MANUFACTURING METHOD

(75) Inventor: Shunji Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 908 days.

(21) Appl. No.: 11/966,350

(22) Filed: Dec. 28, 2007

(65) Prior Publication Data

US 2008/0203173 A1  Aug. 28, 2008

(30) Foreign Application Priority Data

Feb. 22, 2007 (JP) ................................. 2007-042192

(51) Int. Cl.
*G06K 19/06* (2006.01)
(52) U.S. Cl. ..................... 235/492; 340/572.1
(58) Field of Classification Search .......... None
See application file for complete search history.

(56) References Cited

U.S. PATENT DOCUMENTS

| 2006/0232415 A1* | 10/2006 | Okamoto et al. ........ 340/572.1 |
| 2007/0193020 A1 | 8/2007 | Morinaga et al. |
| 2011/0133345 A1 | 6/2011 | Tasaki et al. |

FOREIGN PATENT DOCUMENTS

| EP | 1 536 373 A1 | 6/2005 |
| JP | 6-310874 A | 11/1994 |
| JP | 8-88448 A | 4/1996 |
| JP | 2000-200332 A | 7/2000 |
| JP | 2000-311226 A | 11/2000 |
| JP | 2001-339125 A | 12/2001 |
| JP | 2001-351082 A | 12/2001 |
| JP | 2003-41234 A | 2/2003 |
| JP | 2005-107882 A | 4/2005 |
| JP | 2007102558 A * | 4/2007 |
| TW | 200527311 B | 8/2005 |
| WO | 2005/088526 A1 | 9/2005 |

OTHER PUBLICATIONS

European Search Report dated Jun. 4, 2009, issued in corresponding European Patent Application No. 07124106.1.
Official Letter and Search Report dated Oct. 31, 2011 from the Taiwan Patent Office issued in corresponding Taiwanese Patent Application No. 96149729.(w/partial English translation).

* cited by examiner

*Primary Examiner* — Thien M Le
*Assistant Examiner* — Sonji Johnson
(74) *Attorney, Agent, or Firm* — Westerman, Hattori, Daniels & Adrian, LLP

(57) ABSTRACT

A first pad has first and second sub-pads that are connected to each other by a connection section extending in a manner overlapping with a mounted circuit chip and that are connected to two terminals formed at two positions on a diagonal of a lower surface of the circuit chip, respectively. The second pad has third and fourth sub-pads that are connected to each other via a route bypassing the mounted circuit chip and that are connected to two terminals formed at two positions on the other diagonal of the lower surface of the circuit chip, respectively.

2 Claims, 29 Drawing Sheets

RFID TAG AND RFID TAG MANUFACTURING METHOD

BACKGROUND OF THE INVENTION

1. Field of the Invention

The present invention relates to an RFID (Radio Frequency IDentification) tag which exchanges information with external equipment in a non-contact manner and relates to its manufacturing method. Incidentally, the "RFID tag" used in the present specification is also called as an "RFID tag inlay" among those skilled in the art, meaning an internal constituent part (inlay) used in the "RFID tag". In addition, the "RFID tags" include a contactless IC card.

2. Description of the Related Art

In recent years, various types of RFID tag have been proposed to exchange information with external equipment typified by reader-writers in a non-contact manner by radio (see, for example, Japanese Patent Application Publication Nos. 2000-311226, 2000-200322, 2001-351082).

As a type of RFID tag, there has been proposed a configuration in which an antenna pattern for wireless communications and an IC chip are mounted on a base sheet made of plastics or paper. One possible application for RFID tags of this type is to affix them to goods and identify the goods by exchanging information about the goods with external equipment.

FIG. 1 is a schematic cross-sectional view showing an example of RFID tags of this type.

An RFID tag 10 shown here has an antenna 12 formed of a conductive pattern on a sheet type base 11 and a circuit chip 13 mounted thereon. A circuit for exchanging information with external equipment via the antenna 12 is incorporated into the circuit chip 13. Connection terminals 13a formed on the lower surface of the circuit chip 13 are electrically connected to two mounting pads of the antenna 12 (to be described later), which are formed to be close to each other, by soldering or the like, and each of their surroundings is fixed to the base 11 with an adhesive 14.

Potential use of RFID tags has spread extremely widely and one important factor to actualize the use is how to reduce the manufacturing cost and achieve mass production at low cost.

Arrangement of connection terminals of the circuit chip is one condition that contributes to allowing mass production to reduce the cost of products. When the connection terminals are arranged in such a way that the circuit chip must be directed in a specific direction to be electrically connected to antenna terminals, postures of the circuit chip must be precisely controlled one by one at the time of connection. This may be an impediment to improvement in productivity.

FIG. 2 is a diagram showing a first example of connection terminals formed on the lower surface of the circuit chip.

FIG. 2 shows a square circuit chip 13A. At four corners of the lower surface of the square circuit chip 13A, each of four terminals in total is formed, which is connected to one of two mounting pads 121 and 122 (see FIG. 3) to be described later.

In this case, among the four terminals, two terminals 131 of one diagonal are antenna terminals that are connected to an electronic circuit in the circuit chip 13A to provide an electrical connection to an antenna 12 (see FIG. 1). The other two terminals of the other diagonal are dummy terminals that are non-connected to the electronic circuit in the circuit chip 13A and that aim to improve stabilization of the posture of the circuit chip 13A when the circuit chip 13A is mounted.

FIG. 3 is a diagram showing a positional relationship between the mounting pads and the circuit chip.

Although FIG. 3 shows two mounting pads 121 and 122, these two mounting pads 121 and 122 correspond to two end sections of the antenna 12 shown in FIG. 1, which are positioned at the circuit chip 13 sides and arranged close to each other.

Now, in the structure in which two antenna terminals 131 of one diagonal and two dummy terminals 132 of the other diagonal are formed in the square circuit 13A as shown in FIG. 2. The circuit chip 13A may be disposed in a positional relationship with respect to the mounting pads 121 and 122 as shown in FIG. 3, and may be rotated about a central point O of the circuit chip 13A by any angle of 90 degrees, 180 degrees and 270 degrees in the direction of an arrow from the positional relationship shown in FIG. 3. In any of these arrangements, one of two antenna terminals 131 and 132 is connected to one of two mounting pads 121 and 122, and the other antenna is connected to the other mounting pad. Accordingly, even when the circuit chip is connected to the mounting pad at any rotation position, the normal operation as the RFID tag can be expected.

In other words, this terminal arrangement eliminates the need for considering the direction of the circuit chip in mounting the circuit chip on the mounting pads, and is expected to simplify mounting equipment and achieve high-speed mounting.

However, depending on the configuration, the layout and the like of the electronic circuit in the circuit chip, the antenna terminals 131 of one diagonal and the dummy terminals 132 of the other diagonal cannot be always arranged as shown in FIG. 2. In some cases, the terminals may be arranged as shown in FIG. 4 to be explained below.

FIG. 4 is a diagram showing a second example of a terminal arrangement of the lower surface of the circuit chip.

Similar to the circuit chip 13A in FIG. 2, FIG. 4 shows a square circuit chip 13B, however, the terminal arrangement differs from that of the circuit chip 13A in FIG. 13A. Specifically, each of four terminals in total is formed at one of four corners of the lower surface of the circuit chip 13B. However, among the four terminals, each of two antennas terminals 131 in total is formed at one of two corners along one side 139 of the lower surface of the circuit chip 13B and the remaining two terminals are formed as dummy terminals 132.

The circuit chip 13b having this terminal arrangement is assumed to be rotated by 90 degrees, 180 degrees and 270 degrees.

FIG. 5 is a diagram showing the positional relationship between the mounting pads and the circuit chip 13B having the terminal arrangement shown in FIG. 4.

Part (A) of FIG. 5 shows a state in which the circuit chip 13B shown in FIG. 4 is formed on the mounting pads 121 and 122 with the posture shown in FIG. 4 unchanged. In each of parts (B) to (D) of FIG. 5, a state is shown in which the circuit chip 13B is rotated about a central point O of the circuit chip 13B by each of 90 degrees, 180 degrees and 270 degrees in the direction of an arrow from the posture shown in part (A) of FIG. 5.

As is obvious from parts (B) to (D) of FIG. 5, no problem occurs in the cases of parts (A) and (C) of FIG. 5 since one and the other mounting pads 121 and 122 are formed on one and the other antenna terminals 131, respectively. In the cases of parts (B) and (D) of FIG. 5, both of two antenna terminals 131 are formed on only one of two mounting pads 121 and 122, and the normal operation as the RFID tag cannot be performed if nothing is done.

In other words, in the case of combinations of the circuit chip 13B having the terminal arrangement shown in FIG. 4 and the mounting pads 121 and 122, there is a need to accurately manage postures of the circuit chip 13B in the rotation direction one by one when the circuit chip 13B is mounted, resulting in a large reduction in production efficiency, which causes serious impediments to mass production and cost reduction.

In order to solve this problem, the following technique is proposed in Japanese Patent Application Publication No. 2005-107882.

FIG. 6 is a diagram showing a terminal arrangement of a circuit chip proposed in Japanese Patent Application Publication No. 2005-107882.

A circuit 13C shown in FIG. 6 also has a square shape, however, dummy terminals are not formed unlike those shown in FIGS. 2 and 4, and all of four terminals formed at four corners are antenna terminals connected to the internal circuit. It is noted that two antenna terminals 131a formed at two corners along one side 139a of the lower surface of the circuit chip 13C are connected to each other on the internal circuit, while two antenna terminals 131b formed at two corners along another one side 139b are also connected to each other on the internal circuit.

In Japanese Patent Application Publication No. 2005-107882, various ideas are added to the shape of the mounting pads.

FIG. 7 is a diagram showing a state in which a circuit chip having the terminal arrangement shown in FIG. 6 is formed on mounting pads each having a shape proposed in Japanese Patent Application Publication No. 2005-107882.

Pads 121' and 122' shown in FIG. 7 are shaped to be connected to only any one of four terminals formed at four corners of the circuit chip 13C.

Part (A) of FIG. 7 shows a state in which the circuit chip 13C shown in FIG. 6 is formed on the mounting pads 121' and 122' with the posture shown in FIG. 6 unchanged. In each of parts (B) to (D) of FIG. 7, a state is shown in which the circuit chip 13C is rotated about a central point O of the circuit chip 13C by each of 90 degrees, 180 degrees and 270 degrees in the direction of an arrow from the posture shown in part (A) in FIG. 7.

According to the circuit chip 13C having the terminal arrangement shown in FIG. 6 and the mounting pads 121' and 122' each having a shape shown in FIG. 7, one and the other mounting pads 121' and 122' are formed on one and the other antenna terminals 131a and 131b, respectively, regardless of the rotation state of the circuit chip 13C. Therefore, it is possible to connect the circuit chip 13C to the mounting pads 121' and 122' without considering the rotation of the circuit chip 13C, which is expected to simplify mounting equipment and achieve high-speed mounting.

However, in the case of the proposal of Japanese Patent Application Publication No. 2005-107882 shown in FIGS. 6 and 7, although four terminals are formed at four corners of the lower surface of the circuit chip 13C, respectively, only two terminals contribute to mounting while other two terminals do not contribute to mounting. Despite provision of dummy terminals in the circuit chips 13A and 13B shown in FIGS. 2 and 4 to improve stabilization when they are mounted, variations in position and posture caused in mounting are largely increased, so that performance of the RFID tag may vary greatly.

Moreover, in the circuit chip 13C shown in FIG. 6, although two terminals each are electrically connected to each other in the internal circuit, such connection originally allows the use of only terminals of one diagonal as antenna terminals and terminals of the other diagonal as dummy terminals as shown in FIG. 2. In this case, all four terminals formed at four corners are used for connection without considering the rotation position of the circuit chip as shown in FIG. 3, which makes it possible to improve stabilization of the circuit chip when the circuit chip is mounted, and therefore there are no merits in the configurations as in FIGS. 6 and 7.

SUMMARY OF THE INVENTION

The present invention has been made in view of the above circumstances and provides an RFID tag in which a circuit chip is used when two terminals along one side are terminal antennas and the remaining two terminals are dummy terminals as shown in FIG. 4 and the circuit chip is mounted using all four terminals regardless of a rotation position thereof, and provides a manufacturing method of the RFID tag suitable for mass production.

An RFID tag of the present invention includes: a base; a communication antenna which is wired on the base and has two mounting pads close to each other; and a square circuit chip mounted on the base and electrically connected to the mounting pads to perform radio communications via the mounted antenna, wherein:

the circuit chip has terminals connected to the mounting pads at four corners of a lower surface of the circuit chip, respectively, and among the terminals, two terminals formed at two corners along one side of the lower surface are antenna terminals that connect a circuit mounted on the circuit chip to the antenna, and two terminals except for the antenna terminals are dummy terminals that are non-connected to the circuit, a first pad as one of the two mounting pads has first and second sub-pads that are connected to each other by a connection section extending in a manner overlapping with the mounted circuit chip and that are connected to two of the terminals formed at two positions on one diagonal of the lower surface of the circuit chip, respectively, and a second pad as the other mounting pad of the two mounting pads has third and fourth sub-pads that are connected to each other via a route bypassing the mounted circuit chip connected to the mounting pads and that are connected to remaining two of the terminals formed at two positions on the other diagonal of the lower surface of the circuit chip, respectively.

In the RFID tag of the present invention, a first pad of two mounting pads is composed of first and second sub-pads connected to two terminals formed at two positions on one diagonal of a lower surface of a circuit chip, respectively, and a second pad is composed of third and fourth sub-pads connected to two terminals formed at two positions on the other diagonal of the lower surface of the circuit chip, respectively. Therefore, even when employing the circuit chip having the terminal arrangement shown in FIG. 4 where the terminals formed at two corners along one side of the lower surface of the circuit chip are antenna terminals and two terminals except for these antenna terminals are dummy terminals, it is possible to mount the circuit chip using all four terminals without considering the rotation state, which makes it possible to simplify mounting equipment and achieve high-speed mounting.

In this RFID tag according to the present invention, preferably, each of the third sub-pad and the fourth sub-pad has an adding section expanding to a central position of the lower surface of the mounted circuit chip, so that a total area of the first sub-pad, the second sub-pad and the connection section becomes equal to a total area of the third sub-pad and the fourth sub-pad in terms of region overlapping with the mounted circuit chip.

When the adding sections are provided, parasitic capacitance is maintained constant at the time of mounting even when the circuit chip is mounted in any rotated state, which suppresses a variation in influence on the communication distance due to the parasitic capacitance.

Furthermore, in the RFID tag according to the present invention, preferably, edge lines of each of regions of the first, second, third, and fourth sub-pads overlapping with the mounted circuit chip except for the connection section and the adding sections extend in parallel to each other or perpendicularly to each other, while the connection section and the adding sections are formed in regions overlapping with the mounted circuit chip.

When the circuit chip is mounted on the mounting pads in this way, even if a positional shift between the circuit chip and the mounting pad occurs, parasitic capacitance can be maintained constant during the time of manufacturing numerous products, which suppresses a variation in influence on the communication distance due to the parasitic capacitance and improves stabilization of performance of the product as the RFID tag.

Further, according to the present invention, an RFID tag manufacturing method of manufacturing an RFID tag which has a base, a communication antenna having two mounting pads close to each other and wired on the base, and a square circuit chip mounted on the base and electrically connected to the mounting pads to perform radio communications via the antenna, includes:

a web preparation step in which a web is prepared that serves as the base after being cut and that has a plurality of wiring patterns arranged two-dimensionally to function as the antenna after manufacturing;

a chip alignment step in which a plurality of circuit chips are supplied onto an alignment mask having chip alignment holes into which the circuit chips are to be inserted and which are formed two-dimensionally with the same array pitch as that of wiring patterns arrayed on the web, and the circuit chips are inserted into the chip alignment holes by oscillating or inclining the alignment mask so that the plurality of circuit chips are aligned on the alignment mask;

a chip transfer step in which the circuit chips aligned on the alignment mask are transferred onto the web at one time; and a chip connection step in which the circuit chips transferred onto the web are connected to the respective wiring patterns.

In the REID tag manufacturing method of the present invention, antenna wiring patterns are two-dimensionally arrayed on the web and the circuit chips are transferred on the web to be connected, thereby the RFID tags can be efficiently mass-produced. The rotation state of the circuit chips cannot be controlled in aligning the circuit chips on the alignment mask, but there is no need to control the rotation state of the circuit chips of the RFID tags according to the manufacturing method of the present invention. This manufacturing method allows high efficient production by use of the point that there is no need to control the rotation state of the circuit chip.

In the RFID tag manufacturing method according to the present invention, the chip alignment step may be a step of aligning the plurality of circuit chips on the alignment mask while a lower surface of each of the circuit chips on which surface terminals are arrayed is directed downward, and the chip transfer step may be a step of placing an adhesive support member on upper surfaces of the circuit chips aligned on the alignment mask to transfer the circuit chips onto the support member at one time, and transferring the circuit chips transferred to the support member onto the web at one time.

Alternatively, the chip alignment step may be a step of aligning the plurality of circuit chips on the alignment mask while a lower surface of each of the circuit chips on which surface terminals are arrayed is directed downward, and the chip transfer step may be a step of transferring, at one time, the circuit chips aligned on the alignment mask onto a downward-facing surface of the web on which surface the wiring patterns are formed.

According to the present invention, there is no need to consider the rotation state of the circuit chip when it is mounted, which allows improvement in mass production and cost reduction.

DETAILED DESCRIPTION OF THE INVENTION

The following will explain embodiments of the present invention.

Figure 8:
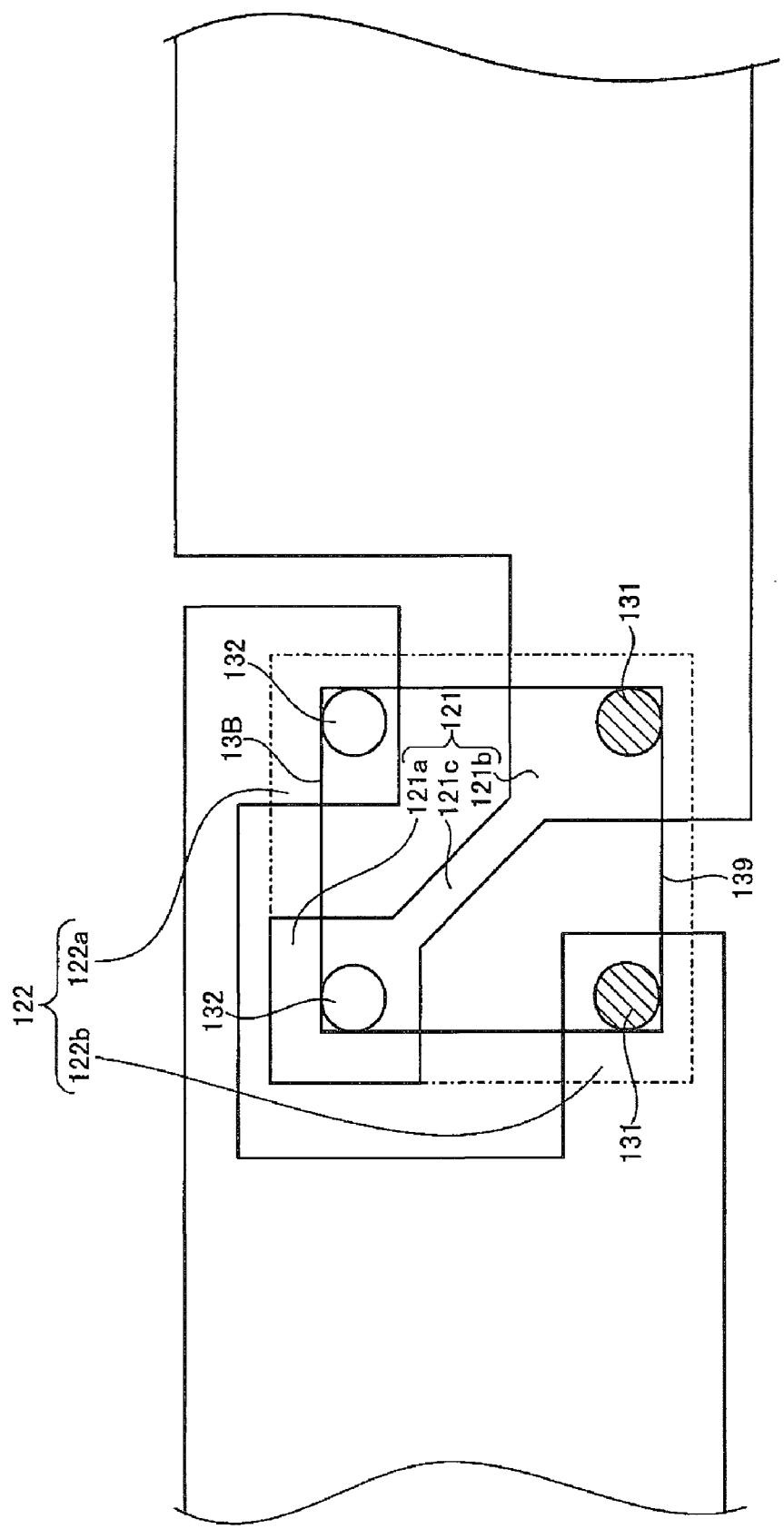
FIG. 8 is an enlarged view of a circuit chip mounting section of an RFID tag according to a first embodiment of the present invention.

FIG. 8 is an enlarged view of a circuit chip mounting section of an RFID tag according to a first embodiment of the present invention.

Figure 4:
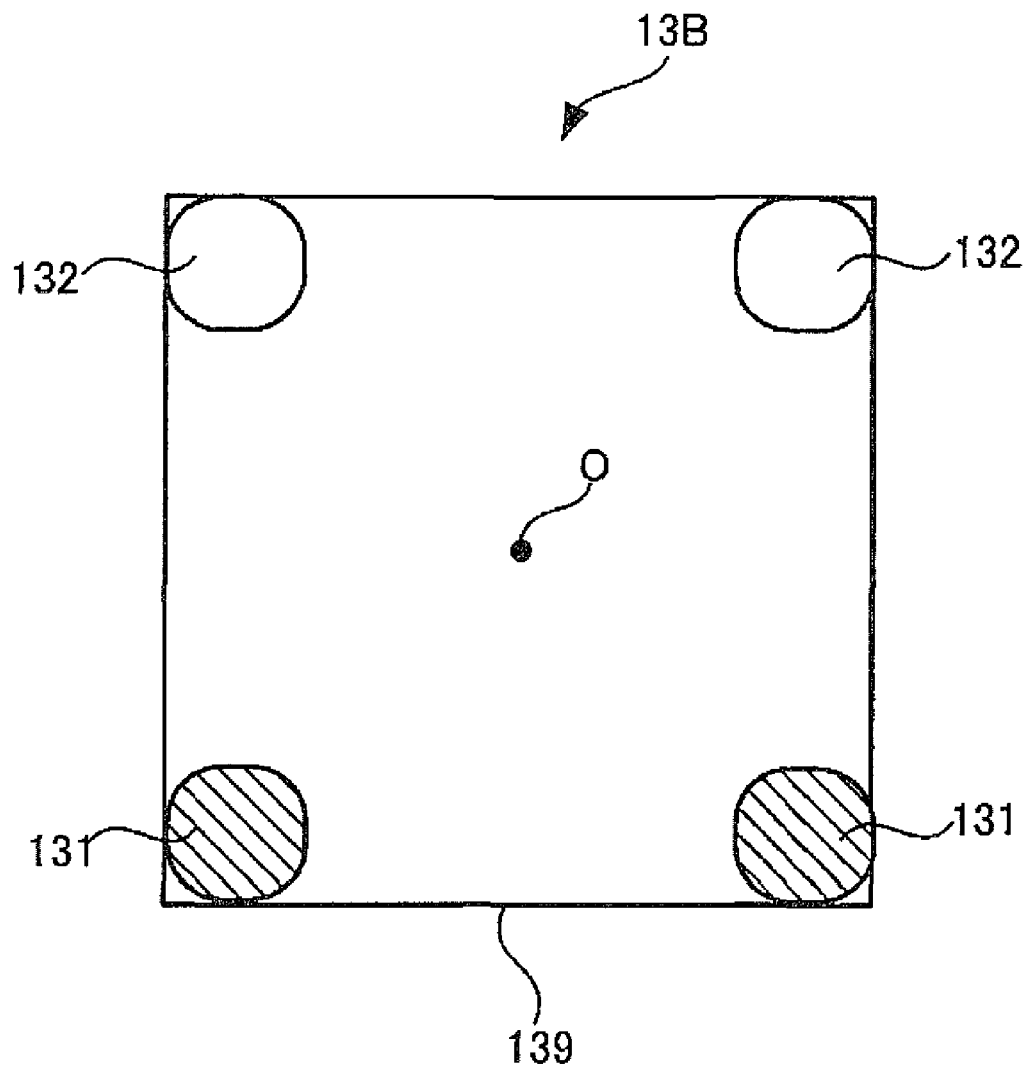
FIG. 4 is a diagram showing a second example of a terminal arrangement on the lower surface of the circuit chip.
Figure 5:
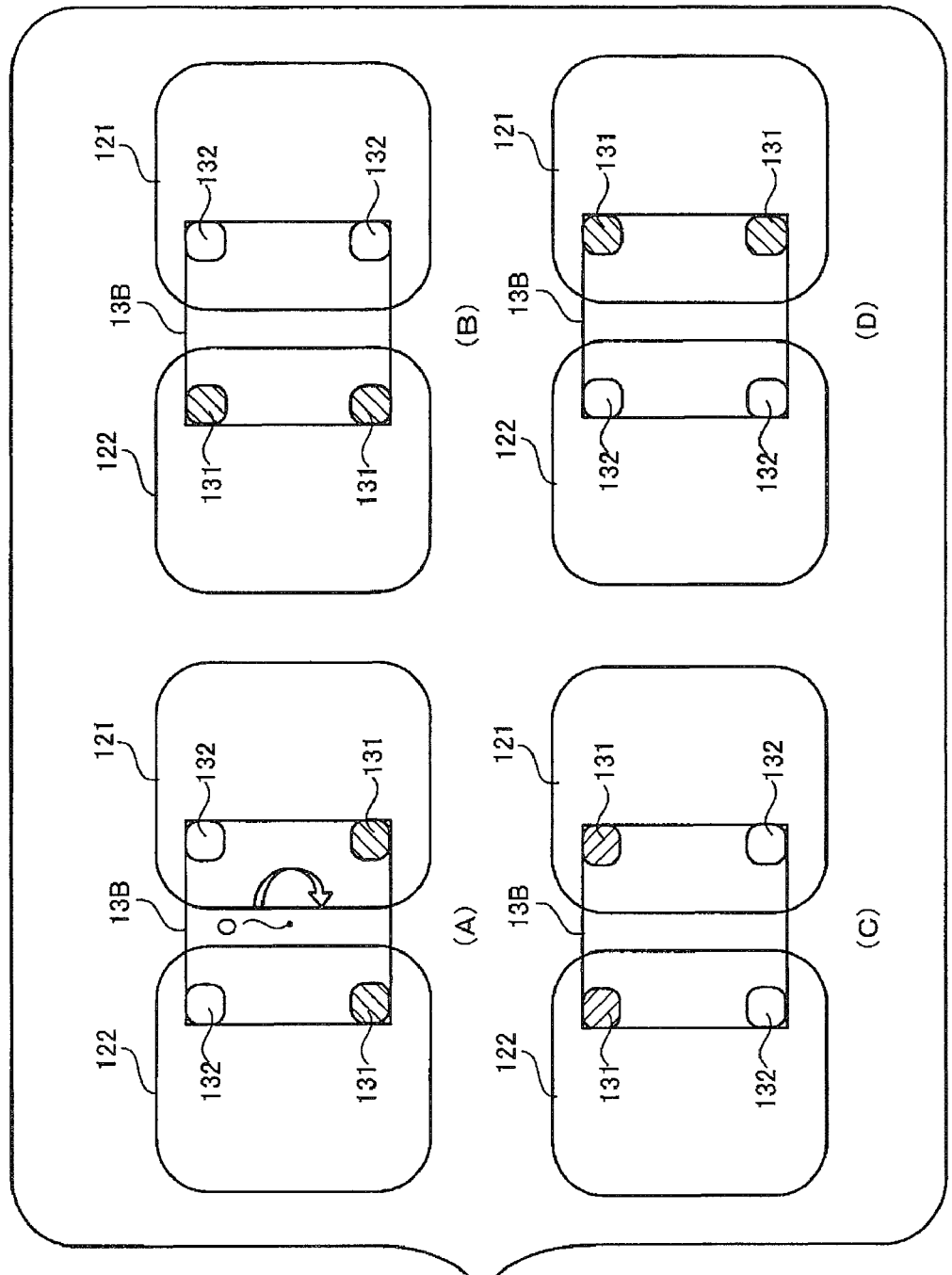
FIG. 5 is a diagram showing a positional relationship between the mounting pads and the circuit chip having the terminal arrangement shown in FIG. 4.
Figure 6:
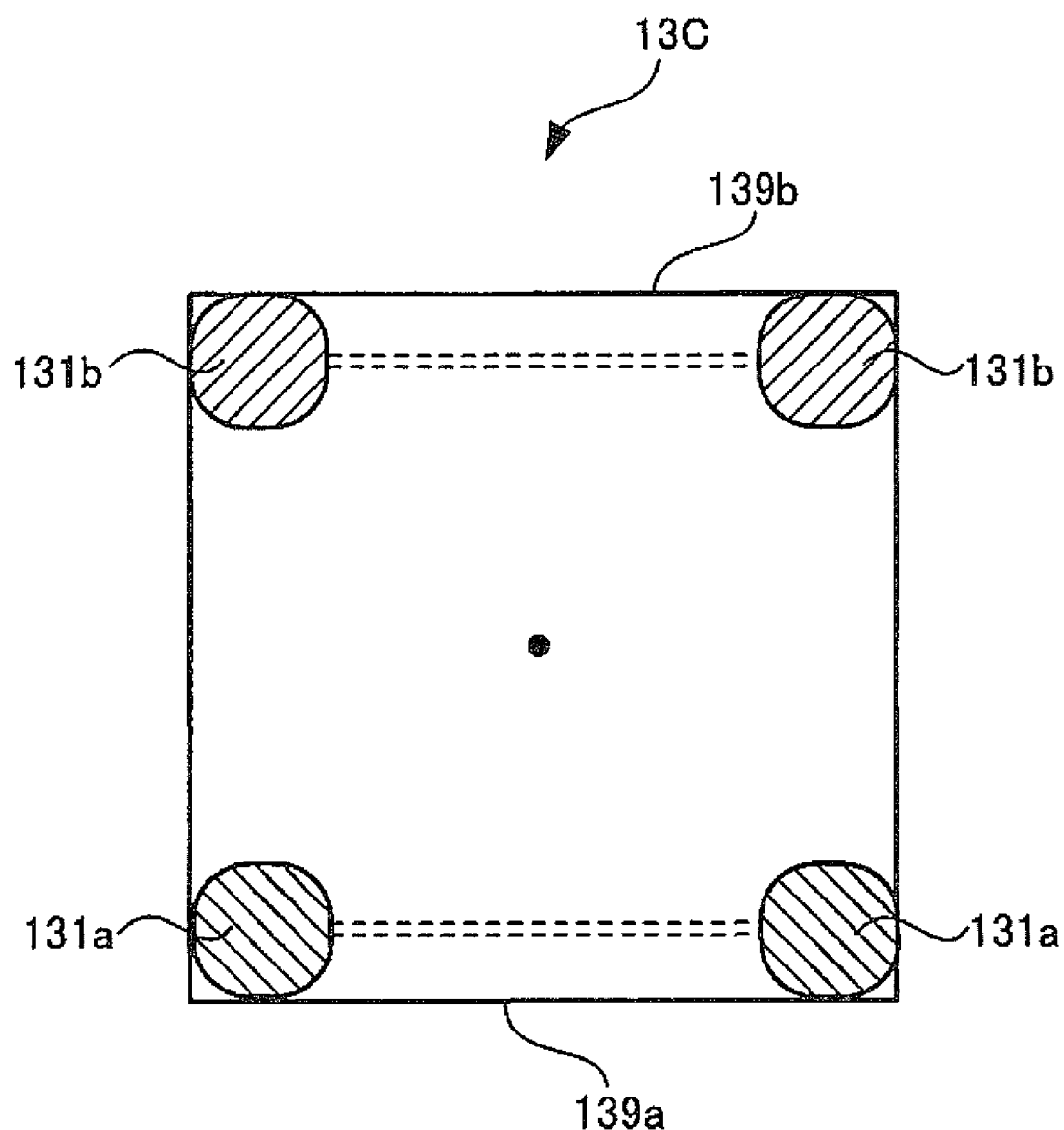
FIG. 6 is a diagram showing a terminal arrangement of a circuit chip proposed in Japanese Patent Application Publication No. 2005-107882.
Figure 7:
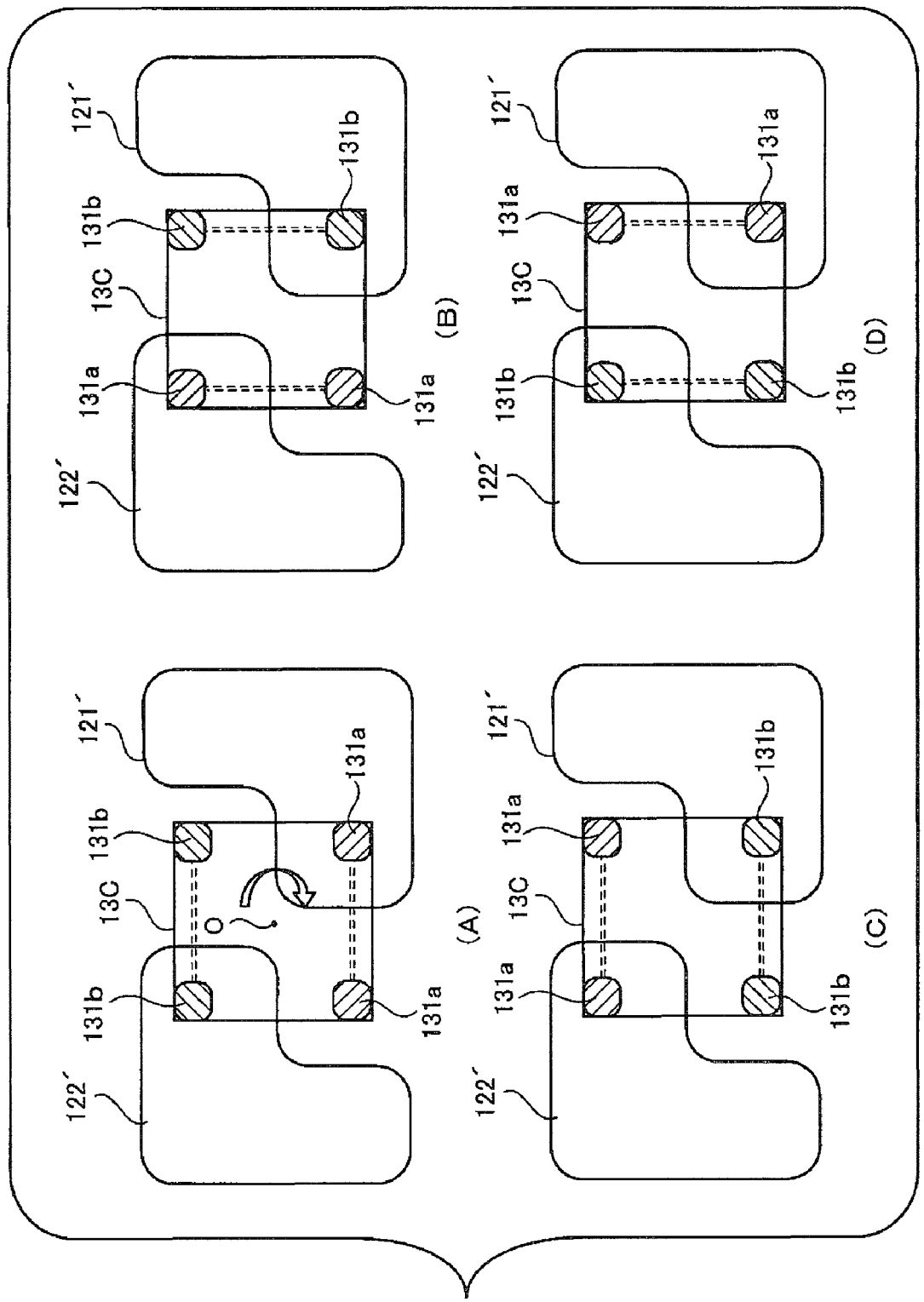
FIG. 7 is a diagram showing a state in which a circuit chip having the terminal arrangement shown in FIG. 6 is formed on mounting pads proposed in Japanese Patent Application Publication No. 2005-107882.

This figure shows the same circuit chip 13B as that shown in FIG. 4.

The circuit chip 13B is square shaped, and has respective terminals at four corners of the lower surface of the circuit chip 13B. Among these four terminals, two terminals, which are formed at two corners along one side 139, respectively, are antenna terminals 131 that connect a circuit mounted on the circuit chip 13B to an antenna. Remaining two terminals except for the two antenna terminals 131 are dummy terminals 132 that are non-connected to the circuit mounted on the circuit chip 13B, and that aim to improve stabilization of the posture of the circuit chip 13B when it is mounted. The circuit 13B is mounted in a mounting region enclosed by an alternate long and short dashed line. The mounting region has: a first mounting pad 121 which is composed of a first sub-pad 121a, a second sub-pad 121b and a connection section 121c; and a second mounting pad 122 which is composed of a third sub-pad 122a and a fourth sub-pad 122b.

The first sub-pad 121a and the second sub-pad 121b of the first mounting pad 121 are connected to two terminals of one diagonal formed on the lower surface of the circuit chip 13B, respectively. The connection section 121c extends in a manner overlapping with the mounted circuit chip 13B, and connects the first sub-pad 121a to the second sub-pad 121b.

Moreover, the third sub-pad 122a and the fourth sub-pad 122b of the second mounting pad 122 are connected to two terminals of the other diagonal formed on the lower surface of the circuit chip 13B, respectively. The third sub-pad 122a and the fourth sub-pad 122b are connected to each other via a route that bypasses the mounted circuit chip 13B.

When the circuit chip 13B is mounted with a rotation position (herein, this is set to zero degree) shown in FIG. 8, the dummy terminal 132 is connected to the first sub-pad 121a, the antenna terminal 131 is connected to the second sub-pad 121b, the dummy terminal 132 is connected to the third sub-pad 122a, and the antenna terminal 131 is connected to the fourth sub-pad 122b. In other words, one antenna terminal 131 is connected to the first mounting pad 121, and another antenna terminal 131 is connected to the second mounting pad 122. Thus, the RFID tag under this connection state operates normally.

Figure 9:
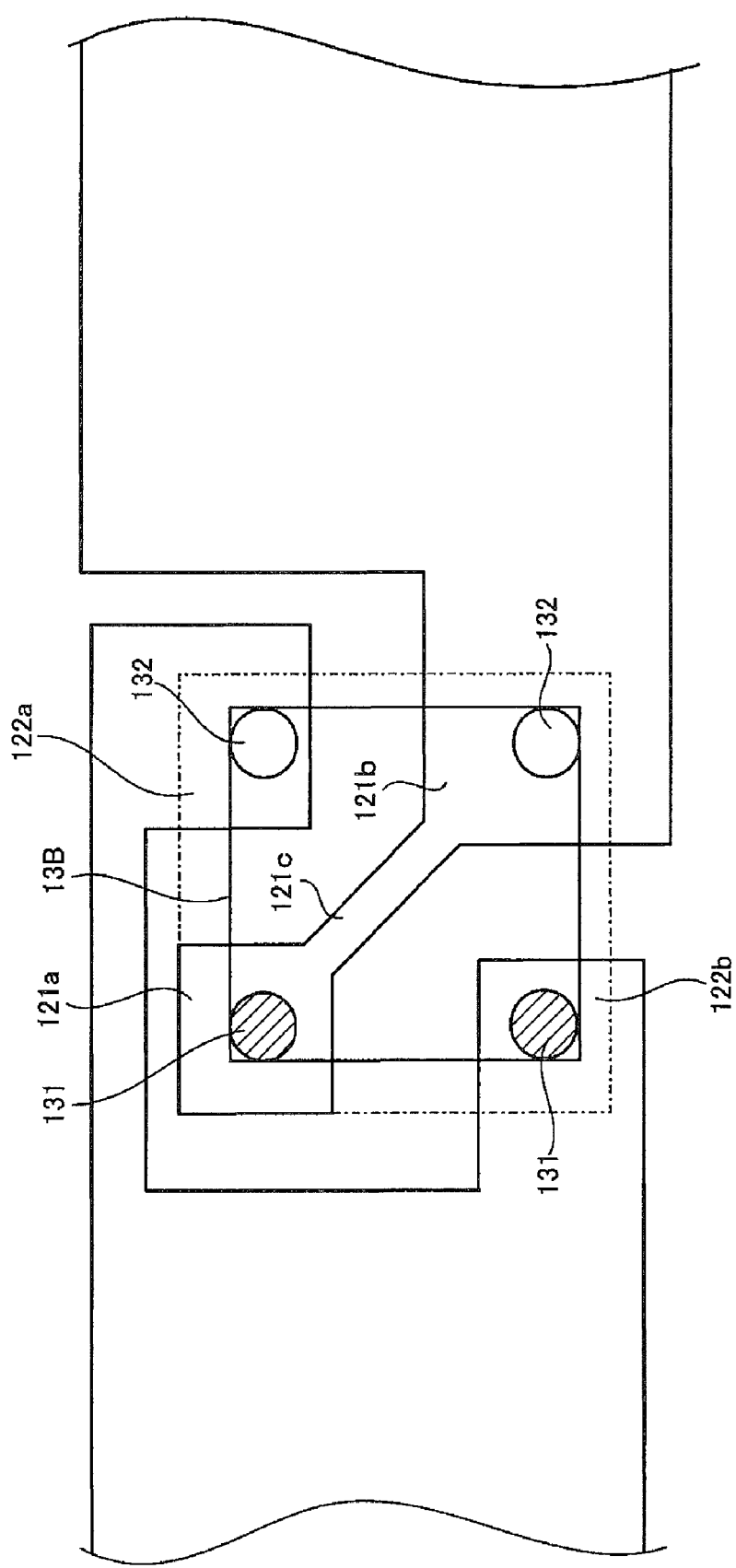
FIG. 9 is a diagram showing a state in which a circuit chip 13B shown in FIG. 8 is rotated by 90 degrees to be mounted on mounting pads.
Figure 10:
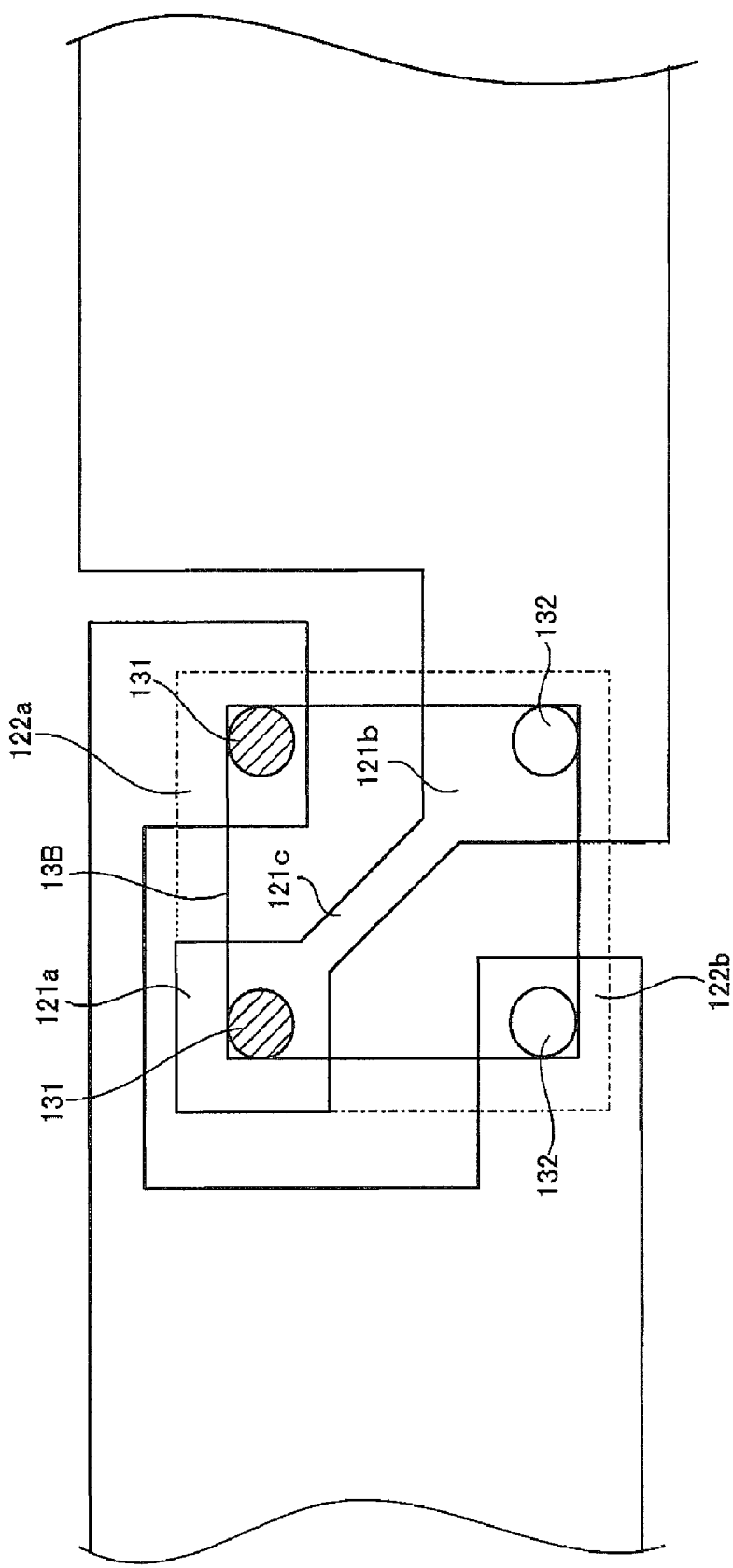
FIG. 10 is a diagram showing a state in which the circuit chip 13B shown in FIG. 8 is rotated by 180 degrees to be mounted on mounting pads.
Figure 11:
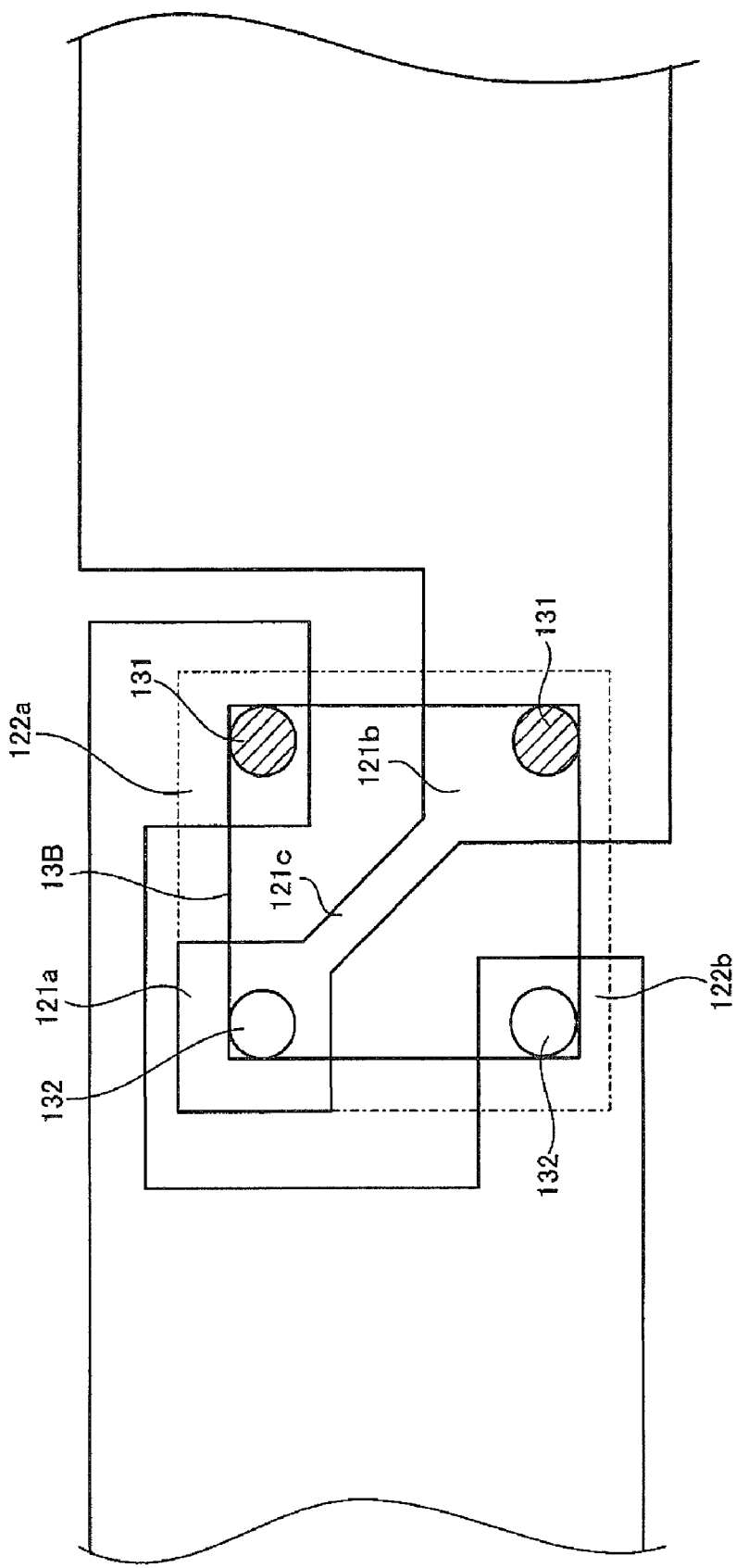
FIG. 11 is a diagram showing a state in which the circuit chip 13B shown in FIG. 8 is rotated by 270 degrees to be mounted on mounting pads.

FIGS. 9, 10 and 11 are diagrams each showing a state in which the circuit chip 13B shown in FIG. 8 is rotated by each of 90 degrees, 180 degrees and 270 degrees to be mounted on the mounting pads.

In a state that the circuit chip 13B is rotated by 90 degrees as shown in FIG. 9, the antenna terminal 131, the dummy terminal 132, the dummy terminal 132, and the antenna terminal 131 are connected to the first sub-pad 121a, the second sub-pad 121b, the third sub-pad 122a, and the fourth sub-pad 122b, respectively. Accordingly, the antenna terminals 131 are connected to both the first mounting pad 121 and the second mounting pad 122, respectively, in which case the RFID tag also operates normally.

In a state that the circuit chip 13B is rotated by 180 degrees as shown in FIG. 10, the antenna terminal 131, the dummy terminal 132, the antenna terminal 131, and the dummy terminal 132 are connected to the first sub-pad 121a, the second sub-pad 121b, the third sub-pad 122a, and the fourth sub-pad 122b, respectively. Accordingly, the antenna terminals 131 are connected to both the first mounting pad 121 and the second mounting pad 122, respectively, in which case the RFID tag also operates normally.

Furthermore, in a state that the circuit chip 13B is rotated by 270 degrees as shown in FIG. 11, the dummy terminal 132, the antenna terminal 131, the antenna terminal 131, and the dummy terminal 132 are connected to the first sub-pad 121a, the second sub-pad 121b, the third sub-pad 122a, and the fourth sub-pad 122b, respectively. Accordingly, the antenna terminals 131 are connected to both the first mounting pad 121 and the second mounting pad 122, respectively, in which case the normal operation of the RFID tag can be also expected.

As is obvious from these FIGS. 8 to 11, according to this embodiment, it is possible to mount the circuit chip 13B on the mounting pads without considering the rotation state of the circuit chip 13B.

Figure 12:
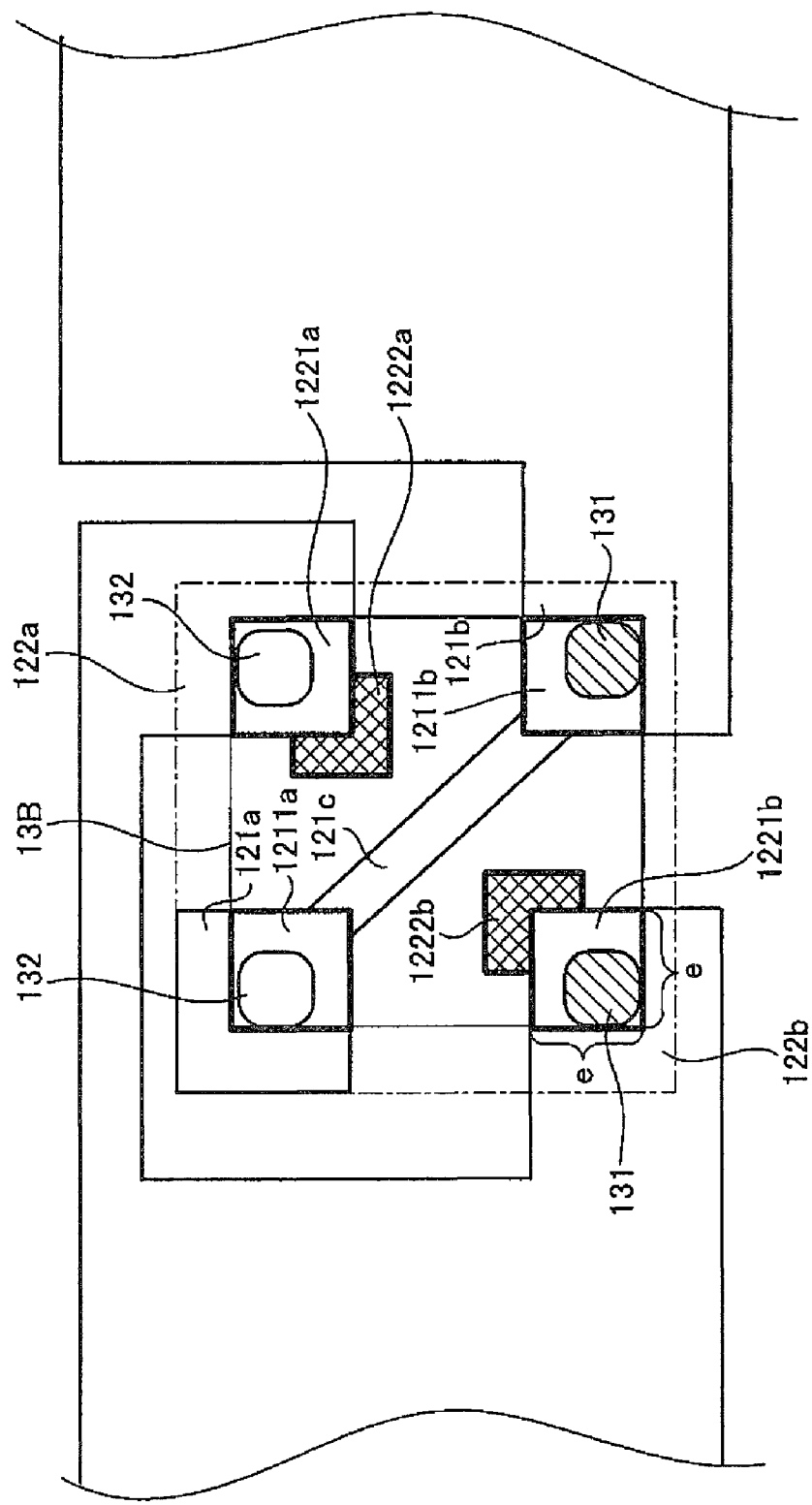
FIG. 12 is an enlarged view of a circuit chip mounting section of an RFID tag according to a second embodiment of the present invention.

FIG. 12 is an enlarged view of a circuit chip mounting section of an RFID tag according to a second embodiment of the present invention.

Herein, the following will explain the points different from the first embodiment shown in FIG. 8.

The difference between the second embodiment and the first embodiment shown in FIG. 8 lies in the point that adding sections 1222a and 1222b are added to the third sub-pad 122a and the fourth sub-pad 122b, respectively. Besides, FIG. 12 differs from FIG. 8 in the way of drawing the figure, for the purpose of explaining the adding sections 1222a and 1222b, and the difference in the RFID tag therebetween is only the presence or absence of the adding sections 1222a and 1222b.

Herein, regarding each of an overlapped region 1211a of the first sub-pad 121a with the mounted circuit chip 13B, an overlapped region 1211b of the second sub-pad 121b with the mounted circuit chip 13B, an overlapped region 1221a of the third sub-pad 122a with the mounted circuit chip 13B, an overlapped region 1221b of the fourth sub-pad 122b with the mounted circuit chip 13B, its edge lines extend in parallel or perpendicularly (for example, vertical and horizontal lines each having a length "e" regarding the overlapped region 1221b, the same is applied to other overlapped regions 1221a, 1211a, 1211b). Also, each of these four regions 1211a, 1211b, 1221a, and 1221b has an area, "e×e", as a design central value with no consideration of the positional shift of the circuit chip 13B when it is mounted. The positional shift of the circuit chip 13B when it is mounted will be described later.

Moreover, in this case, each of the two adding sections 1222a and 1222b is decided such that an area of the connection section 121c and a total area of the two adding sections 1222a and 1222b are equal to each other. Specifically, in this embodiment, each of the two adding sections 1222a and 1222b has an area equal to a half of that of the connection section 121c. In this way, the total area of the overlapped region 1211a of the first sub-pad 121a with the mounted circuit chip 13B, the overlapped region 1211b of the second sub-pad 121b with the mounted circuit chip 13B and the connection section 121c becomes equal to the total area of the overlapped region 1221a and 1222a of the third sub-pad 122a with the mounted circuit chip 13B and the overlapped region 1221b and 1222b of the fourth sub-pad 122b with the mounted circuit chip 13B. An influence of parasitic capacitance caused when the circuit chip 13B is mounted is maintained constant regardless of the rotation position of the circuit chip 13B. Thus, it is possible to suppress a variation in characteristics of the RFID tag such as to keep an influence on the communication distance constant, which improves stabilization of quality.

An explanation will be next given of an influence of variation in the mounting position of the circuit chip 13B.

Figure 13:
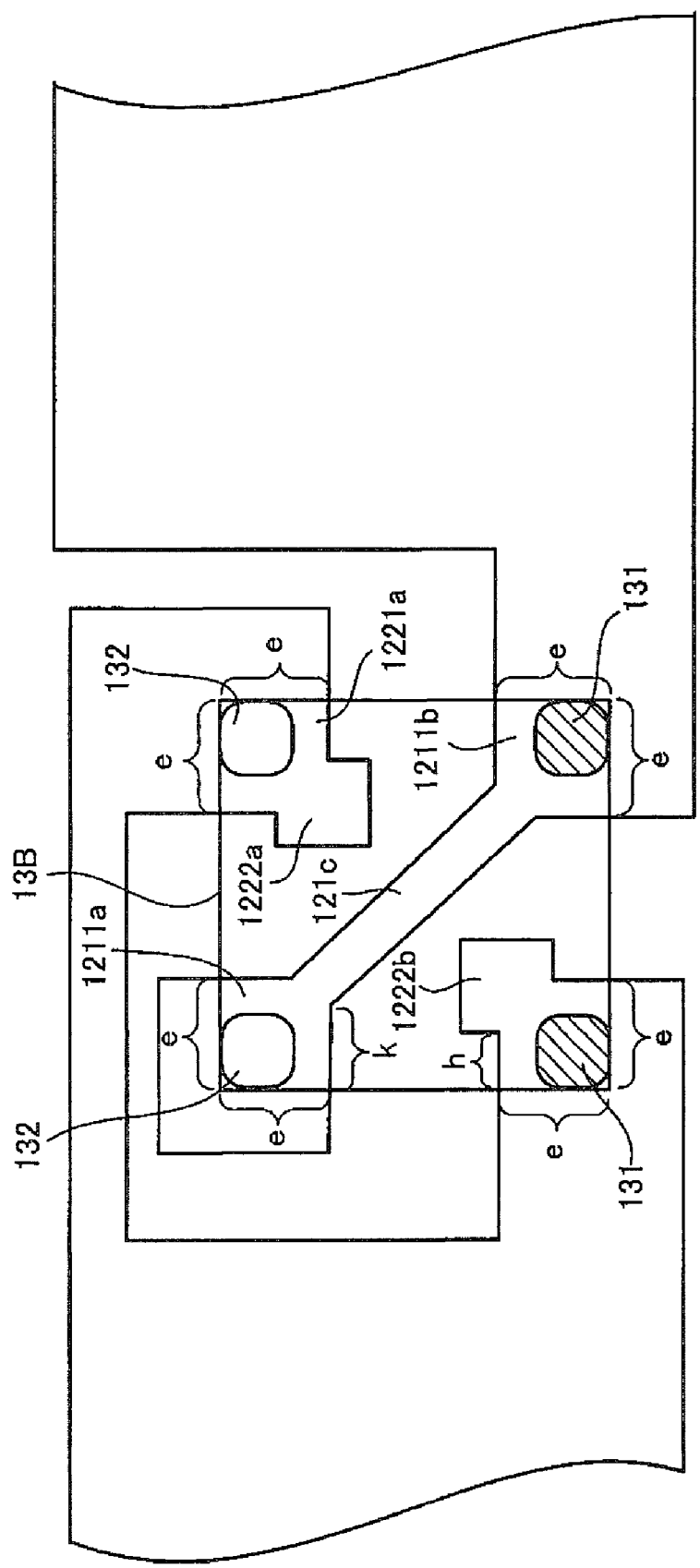
FIG. 13 is a diagram of the RFID tag according to the second embodiment of the present invention shown in FIG. 12 to indicate a state in which a circuit chip is mounted at a standard position as in a design value.
Figure 14:
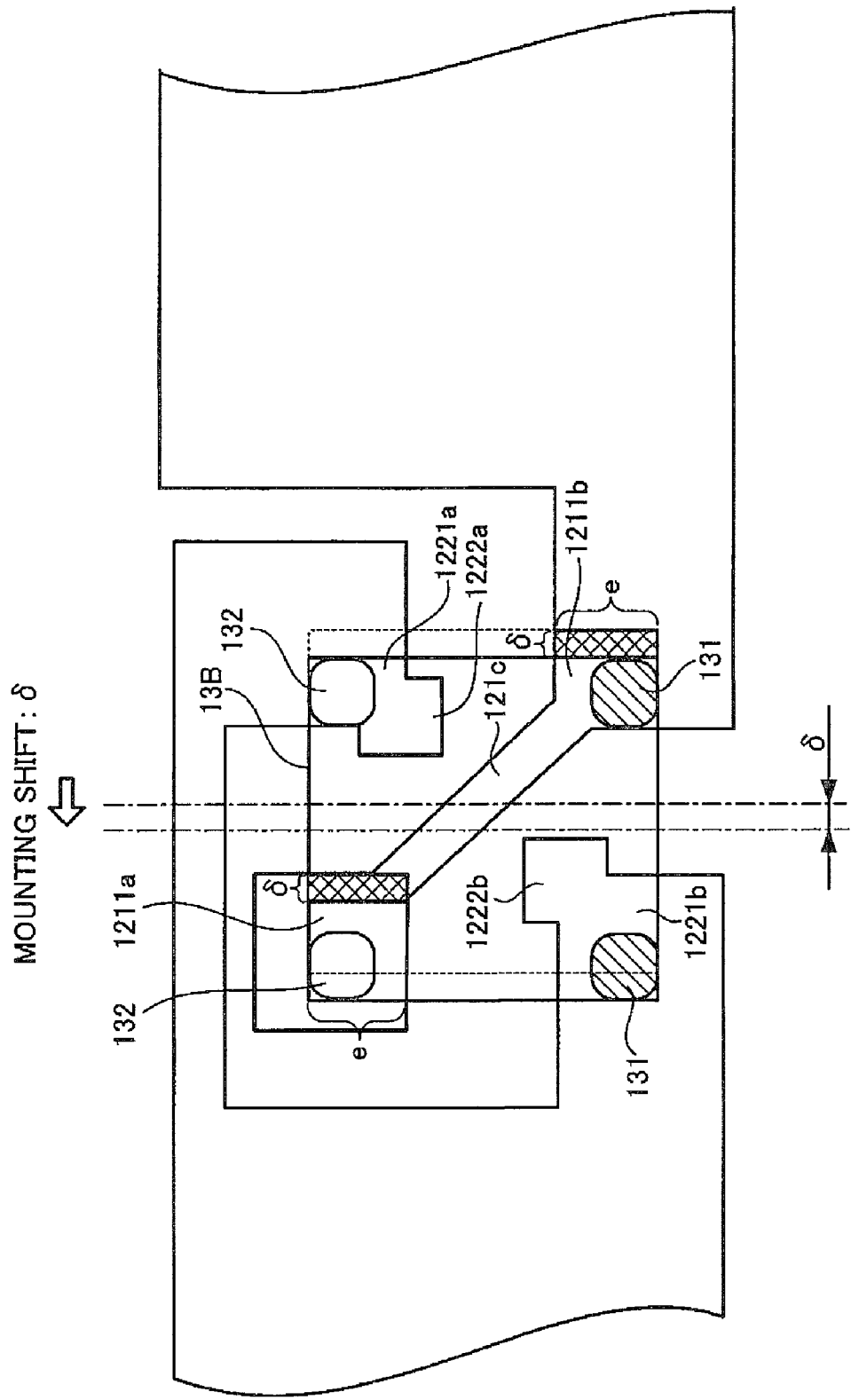
FIG. 14 is a diagram of the RFID tag according to the second embodiment of the present invention shown in FIG. 12 to indicate a state in which the circuit chip is mounted at a position shifted horizontally by $\delta$ as compared with the standard position shown in FIG. 13.

FIG. 13 is a diagram of an RFID tag according to a second embodiment of the present invention shown in FIG. 12 to indicate a state in which the circuit chip is mounted at a standard position as in a design value. FIG. 14 is a diagram of the RFID according to the second embodiment of the present invention shown in FIG. 12 to indicate a state in which the circuit chip is mounted at a position shifted horizontally by δ as compared with the standard position shown in FIG. 13.

Herein, it is assumed that "e" shown in FIG. 13 are all equal, and an inequality, δmax≦k, δmax≦h, is established with respect to a maximum mounting shift length δmax to be estimated. Further, the circuit chip 13B has a square shape, and its contour line extends in up and down directions or left and right directions. Moreover, all the edge lines, of the respective overlapped regions 1211a, 1211b, 1221a and 1221b with the circuit chip 13B formed on the respective pads, also extend in up and down directions or left and right directions. As a result, even if the circuit chip 13B is shifted by a shift length δ within the maximum mounting shift length δmax from the standard position, the area of the overlapped region with the circuit chip 13B is unchanged in comparison between the first mounting pad and the second mounting pad. Thus, the performance of the RFID tag is stably maintained.

In FIG. 14, the circuit chip 13B is horizontally shifted by the mounting shift length δ, so that the area of the overlapped region 1211a of the first sub-pad is increased by "δ×e", and the area of the overlapped region 1211b of the second sub-pad is decreased by "δ×e". As a result, the area of the overlapped region of the first mounting pad with the circuit chip 13B—which first mounting pad is composed of the first sub-pad, the second sub-pad, and the connection section 121c—is maintained constant regardless of the length of the mounting shift "δ". Likewise, the area of the overlapped region 1221a of the third sub-pad is decreased by "δ×e", and the area of the overlapped region 1221b of the fourth sub-pad is increased by "δ×e". As a result, the area of the overlapped region of the second mounting pad with the circuit chip 13B—which second mounting pad is composed of the third sub-pad, the fourth sub-pad, and the respective adding sections 1222a and 1222b—is maintained constant regardless of the length of the mounting shift "δ". FIG. 14 shows the state in which the circuit chip 13B is shifted in the left direction in FIG. 14 to be mounted. However, even if the circuit chip 13B is shifted in the right direction in FIG. 14 to be mounted, the area of the overlapped region of the first mounting pad with the circuit chip 13B, and the area of the overlapped region of the second mounting pad with the circuit chip 13B are maintained constant. Moreover, even if the circuit chip 13B is shifted in the upward or downward direction in FIG. 14 to be mounted, the same result is obtained.

An explanation will be next given of an embodiment of an RFID tag manufacturing method of the present invention.

Figure 1:
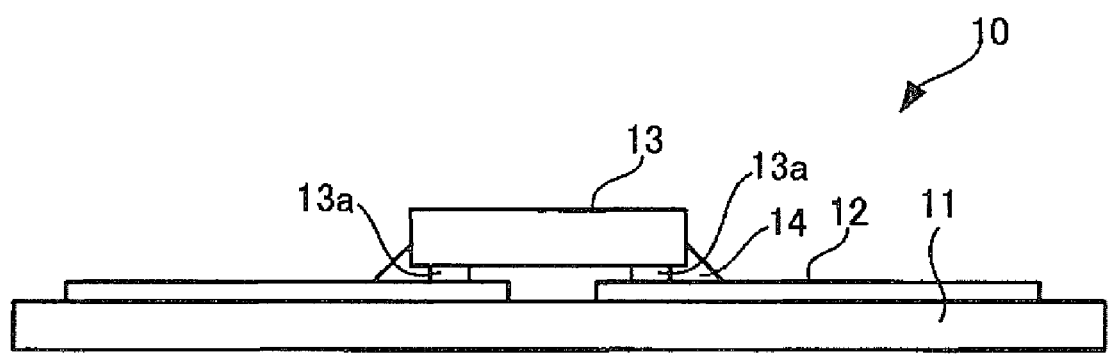
FIG. 1 is a schematic cross-sectional view showing one example of an RFID tag.
Figure 2:
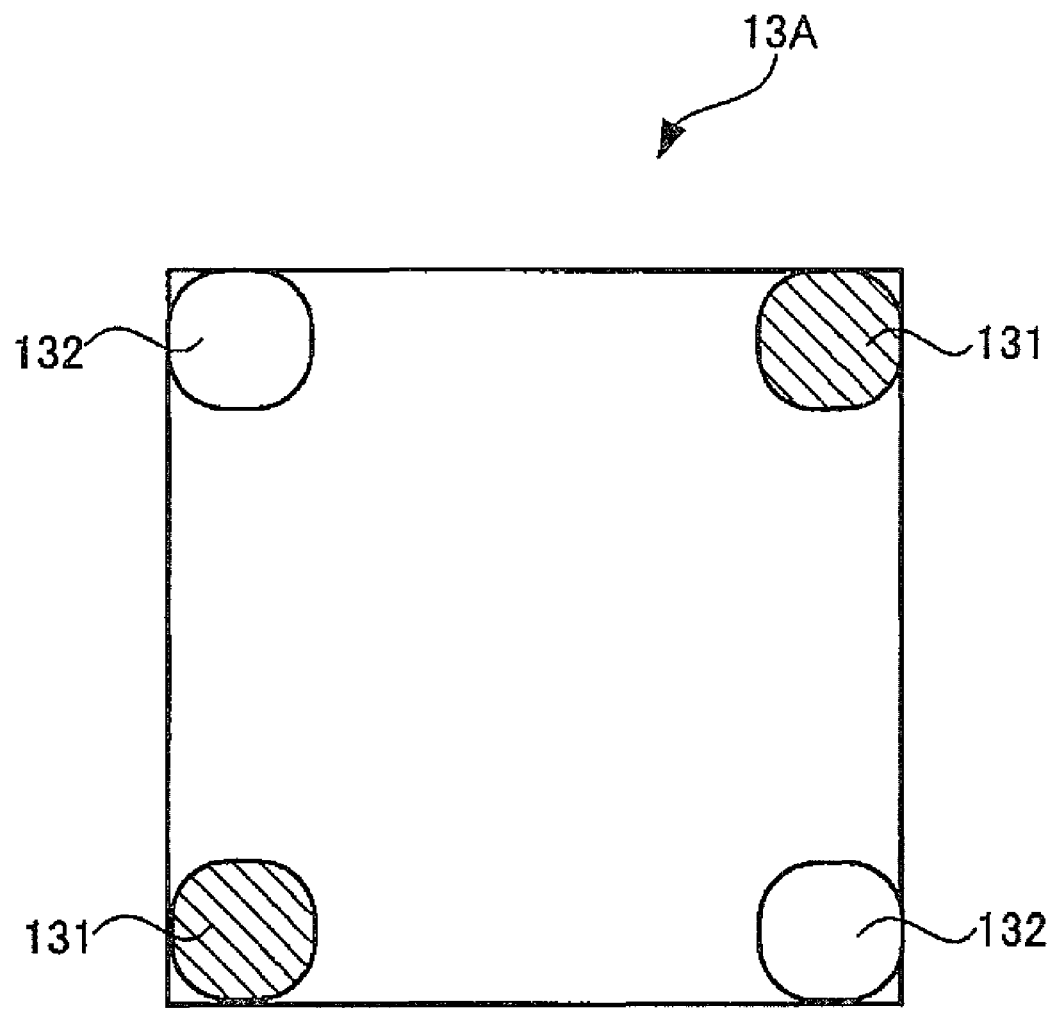
FIG. 2 is a diagram showing a first example of a terminal arrangement on the lower surface of a circuit chip.
Figure 3:
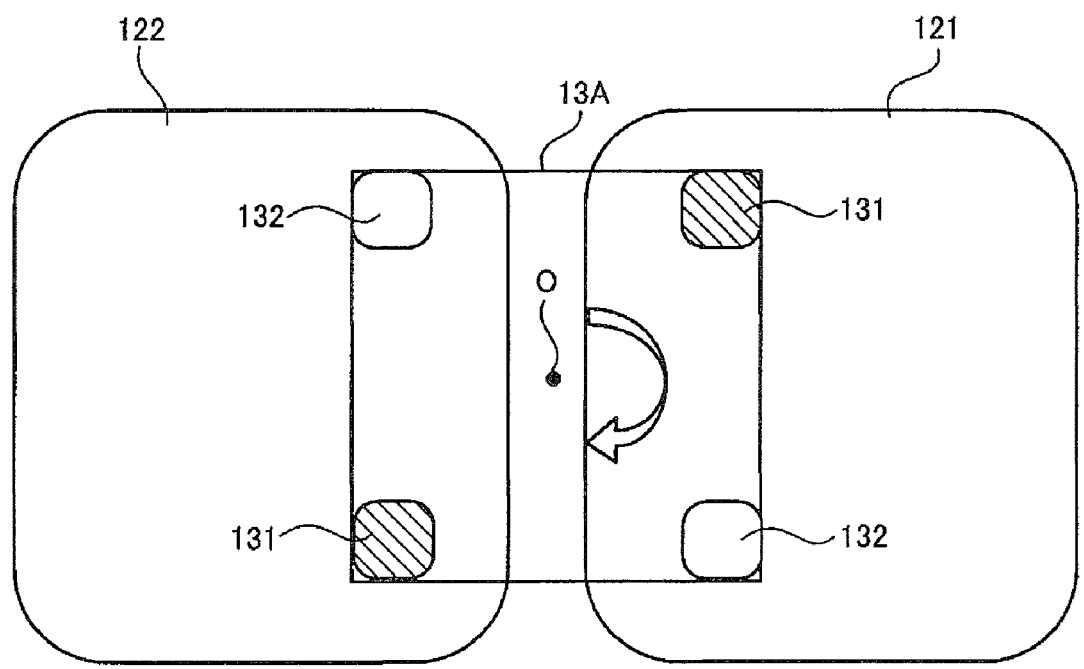
FIG. 3 is a diagram showing a positional relationship between mounting pads and the circuit chip.
Figure 15:
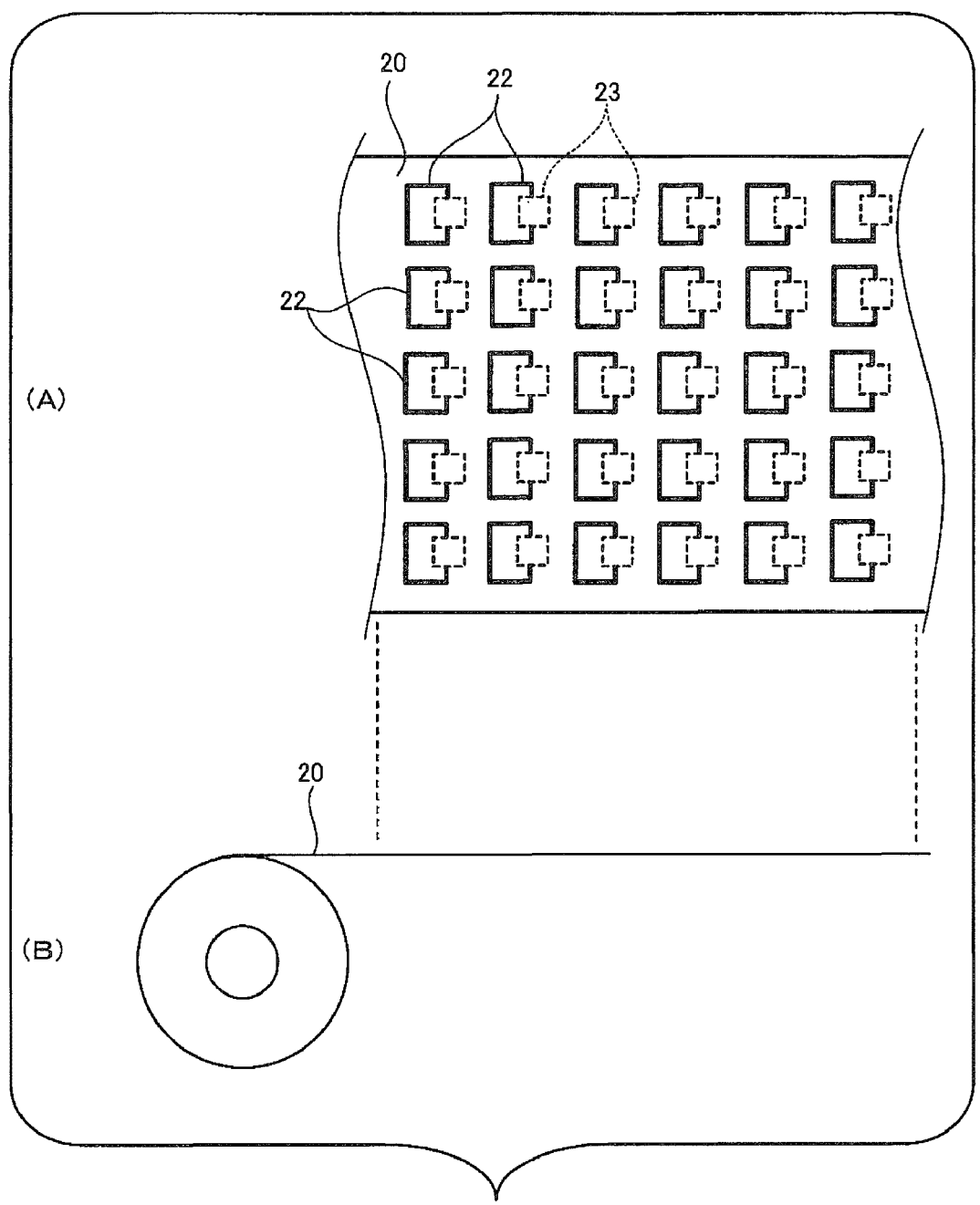
FIG. 15 is a diagram showing a web serving as a base of the RFID tag after cutting (see the base 11 in FIG. 1).

FIG. 15 is a diagram showing a web serving as a base of the RFID tag after cutting (see the base 11 in FIG. 1).

A web 20 shown in FIG. 15 is rolled as shown in part (B) of FIG. 15. Part (A) of FIG. 15 is an enlarged plan view of a part of the web 20, and multiple wiring patterns 22 functioning as an antenna (see the antenna 12 in FIG. 1) are two-dimensionally arrayed on the web 20 with a fixed pitch after the RFID tag is manufactured. Moreover, in part (A) of FIG. 15, chip mounting regions 23 are each indicated by a broken line.

Figure 16:
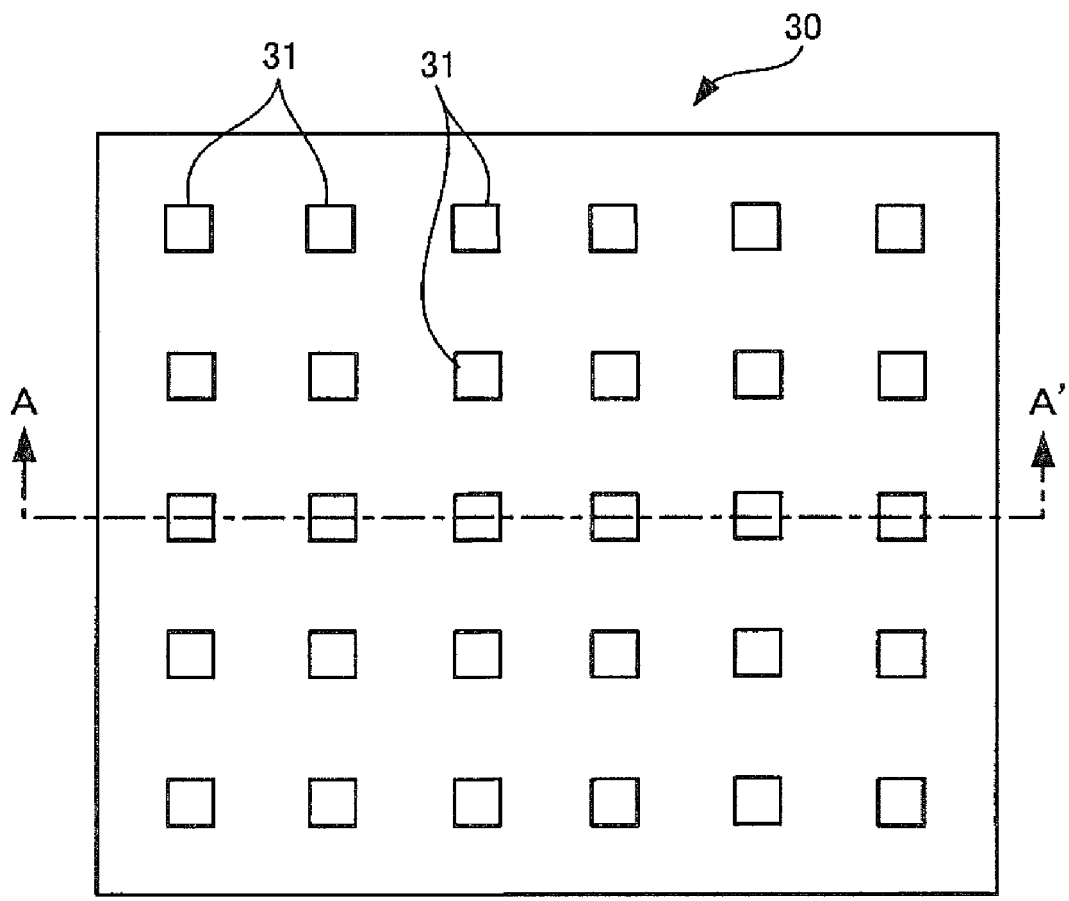
FIG. 16 is a plan view of an alignment mask.
Figure 17:
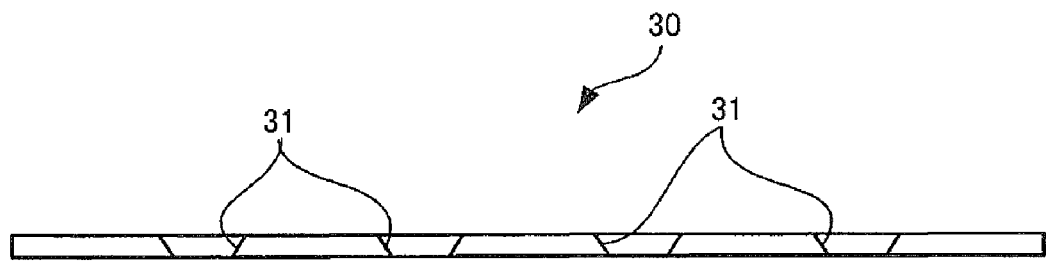
FIG. 17 is a cross-sectional view taken along line A-A' of FIG. 16.

FIG. 16 is a plan view of an alignment mask, and FIG. 17 is a cross-sectional view taken along line A-A' of FIG. 16. Incidentally, in this cross-sectional view, the number of chip alignment holes 31 formed on an alignment mask 30 is reduced and shown in an enlarged manner. Moreover, FIG. 18 is a diagram showing a state in which circuit chips are aligned on the alignment mask shown in FIGS. 16 and 17.

Figure 18:
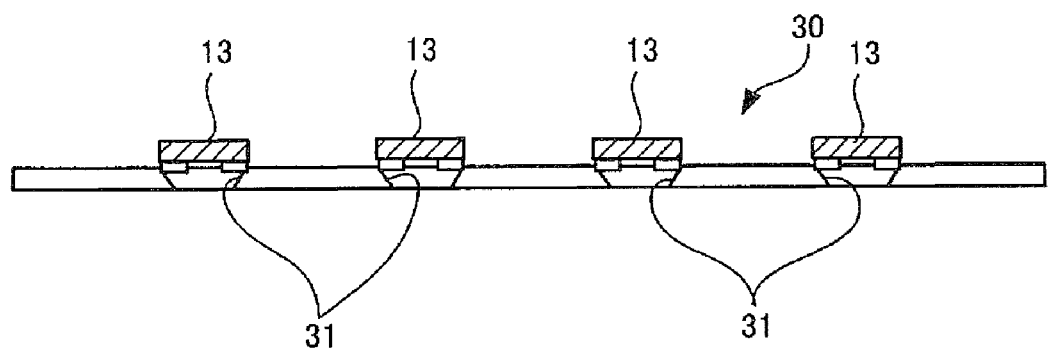
FIG. 18 is a diagram showing a state in which circuit chips are aligned on the alignment mask shown in FIGS. 16 and 17.

On the alignment mask 30, there are the two-dimensionally arrayed chip alignment holes 31 in which the circuit chips 13 are inserted as shown in FIG. 18.

The array pitch of the chip alignment holes 31 is the same as that of the wiring patterns 22 on the web 20 shown in FIG. 15. Each chip alignment hole 31 has a taper shape that has a surface with a wide opening and becomes gradually narrower towards the rear face side in order to align the circuit chips 13 smoothly. The positional accuracy of the alignment of the circuit chips 13 depends on the accuracy of the array of chip alignment holes 31. However, in this case, a thin stainless steel plate or metallic plate made of a material such as aluminum is used as the alignment mask 30, and the chip alignment holes 31 are formed by etching. Thus, the chip alignment holes 31 can be formed with sufficiently high positional accuracy by etching.

Figure 19:
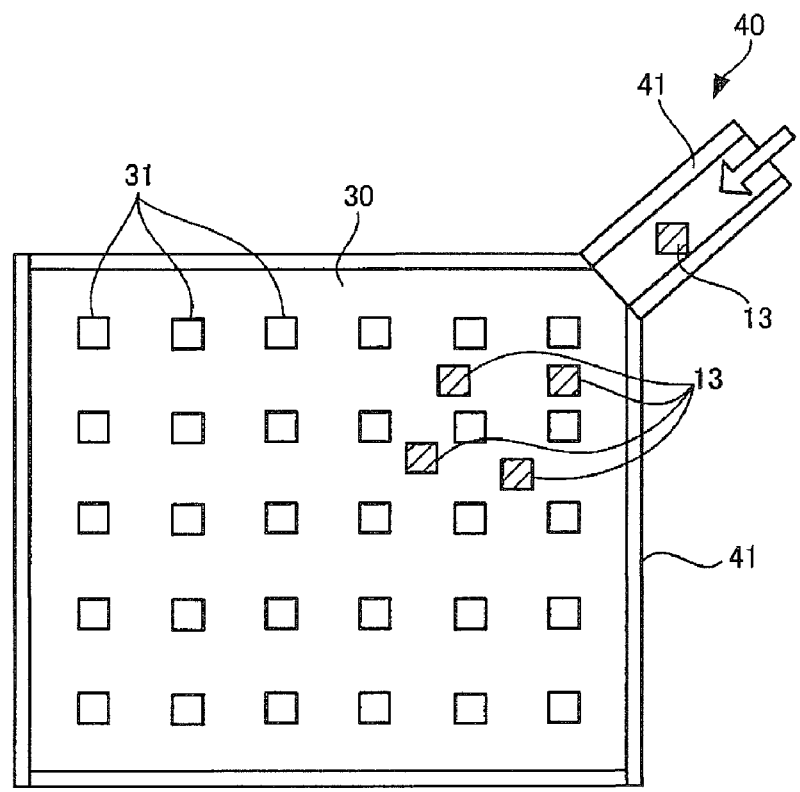
FIG. 19 is a plan view showing a state of supply of circuit chips onto the alignment mask.
Figure 20:
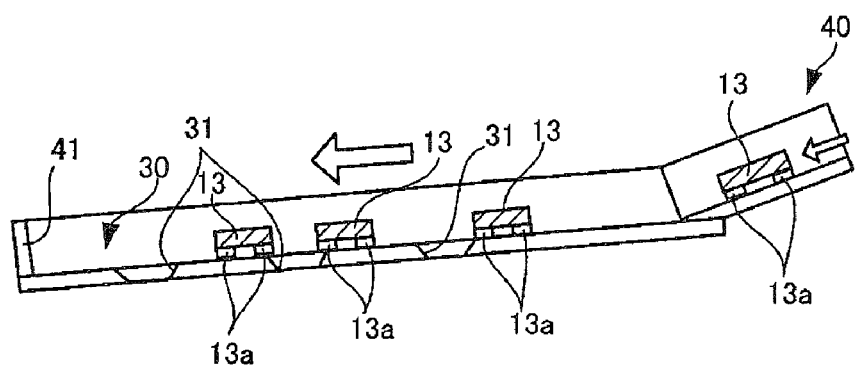
FIG. 20 is a cross-sectional view showing a state of supply of circuit chips onto the alignment mask.

FIGS. 19 and 20 are a plan view and a cross-sectional view each showing a state of supply of circuit chips onto the alignment mask.

In this embodiment, a chip supply jig 40 having a frame 41 is attached to the alignment mask 30 to prevent the circuits chips 13 supplied onto the alignment mask 30 from dropping. The chip supply jig 40 is inclined as a whole as shown in FIG. 20 to supply the same number of circuit chips 13 as that of the alignment holes 31 formed on the alignment mask 30. In this case, the circuit chips 13 are supplied in a state that the terminal 13a (see the terminal 13a in FIG. 1) connected to the antenna is directed downward. A soldering ball (not shown) for soldering later is fixed onto the terminal 13a of the circuit chip 13.

Figure 21:
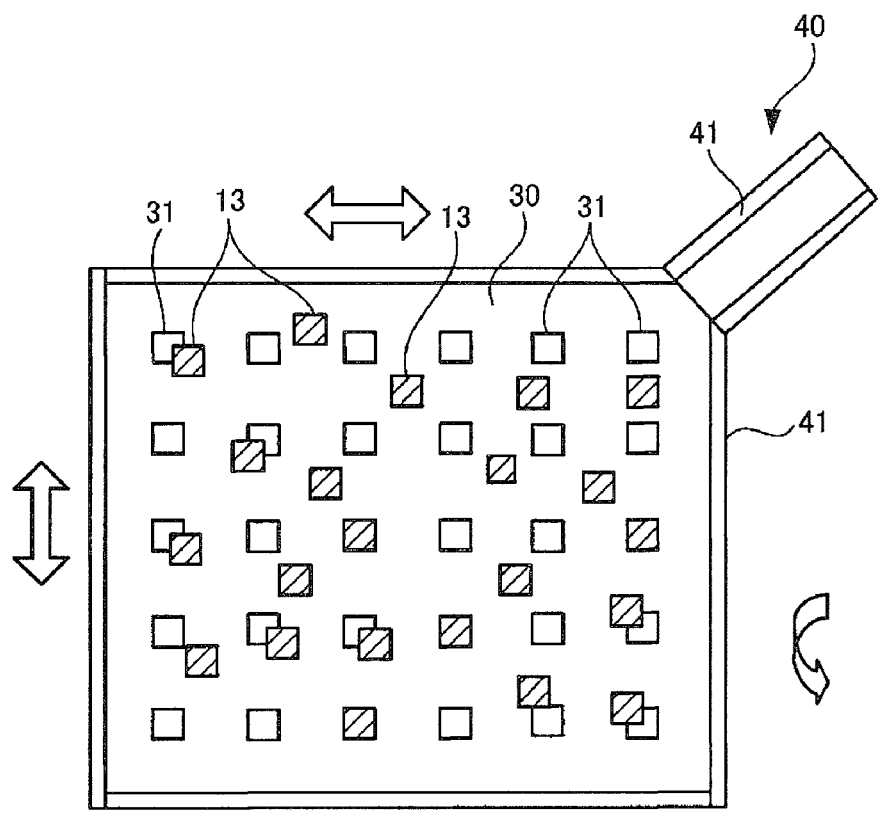
FIG. 21 is a plan view showing a state in which circuit chips are aligned after the necessary number of circuit chips are supplied on the alignment mask.
Figure 23:
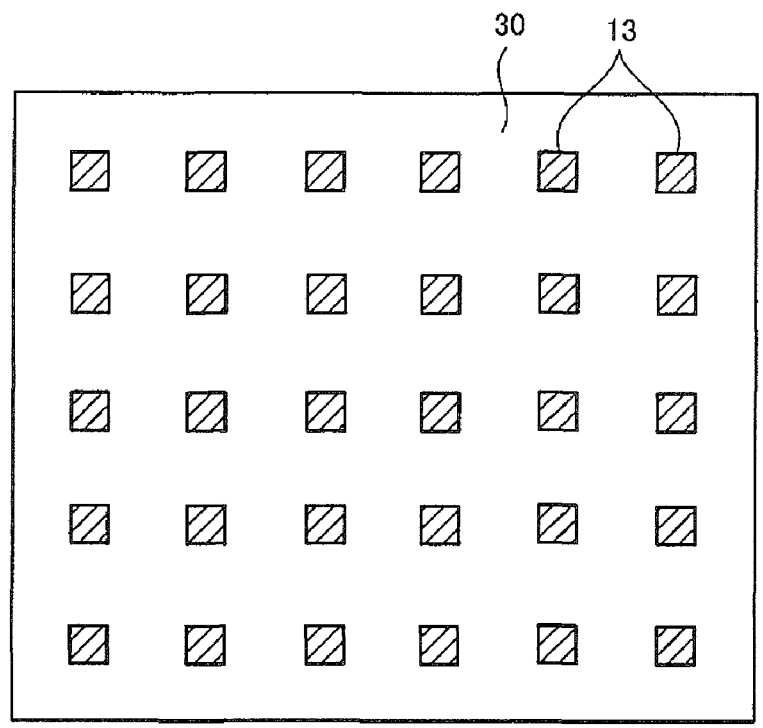
FIG. 23 is a plan view showing a state in which circuit chips are aligned on the alignment mask.
Figure 24:
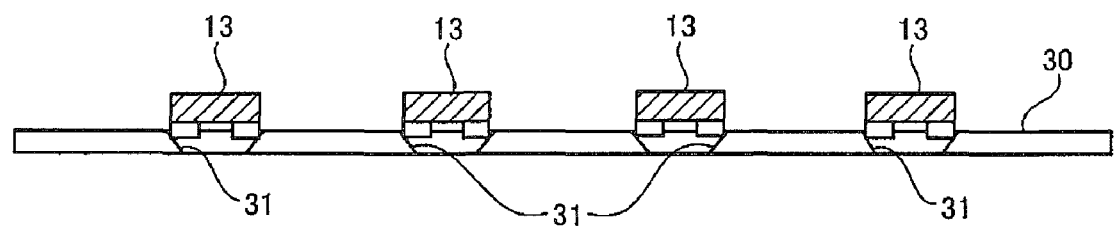
FIG. 24 is a cross-sectional view showing a state in which circuit chips are aligned on the alignment mask.

FIGS. 21 and 23 are a plan view and a cross-sectional view each showing a state in which the circuit chips are aligned after the necessary number of circuit chips are supplied onto the alignment mask. FIGS. 23 and 24 are a plan view and a cross-sectional view each showing a state in which the circuit chips are aligned on the alignment mask.

Figure 22:
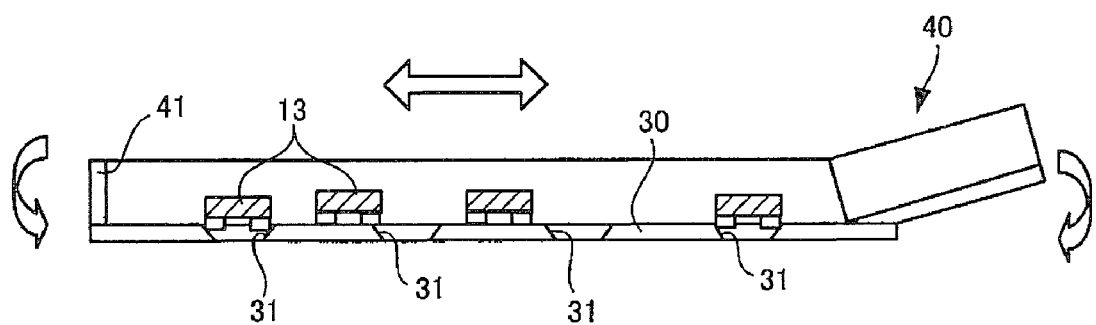
FIG. 22 is a cross-sectional view showing a state in which circuit chips are aligned after the necessary number of circuit chips are supplied on the alignment mask.

After the supply of the circuit chips 13 onto the alignment mask 30 is completed, the entirety of the alignment mask 30 is next oscillated or inclined in various directions as illustrated by arrows in FIGS. 21 and 22 to insert the circuit chips 13 into the chip alignment holes 31 one by one to thereby align the circuit chips 13 as shown in FIGS. 23 and 24.

Figure 25:
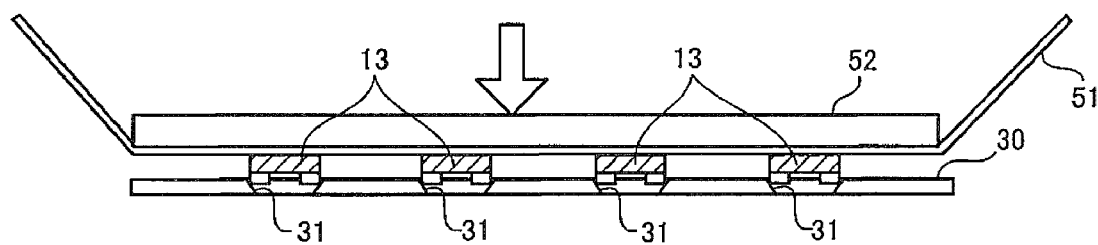
FIG. 25 is a diagram showing a state in which an adhesive film is pressed onto the circuit chips on the alignment mask.
Figure 26:
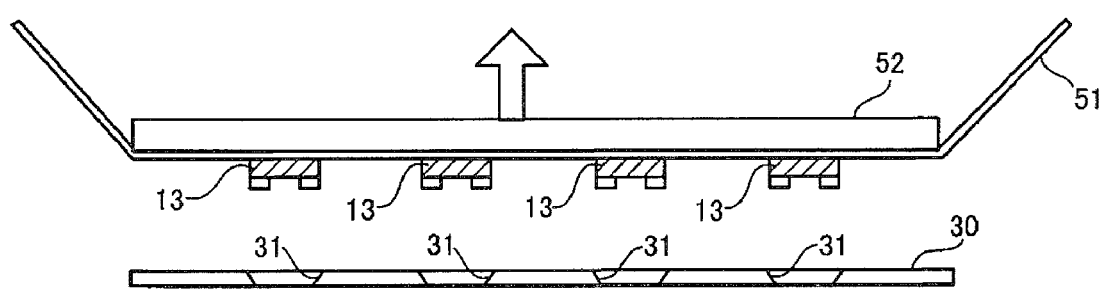
FIG. 26 is a diagram showing a state in which the circuit chips on the alignment mask are adhered onto the adhesive film, and the result is lifted.

FIG. 25 is a diagram showing a state in which an adhesive film is pressed onto the circuit chips on the alignment mask, and FIG. 26 is a diagram showing a state in which the circuit chips on the alignment mask are adhered onto the adhesive film and the result is lifted.

When the alignment of circuit chips 13 onto the alignment mask 30, an adhesive film 51 is pressed onto the circuit chips 13 on the alignment mask 30 with a press plate 52 as shown in FIG. 25, and the circuit chips 13 aligned on the alignment mask 30 are lifted at one time as shown in FIG. 26.

Figure 27:
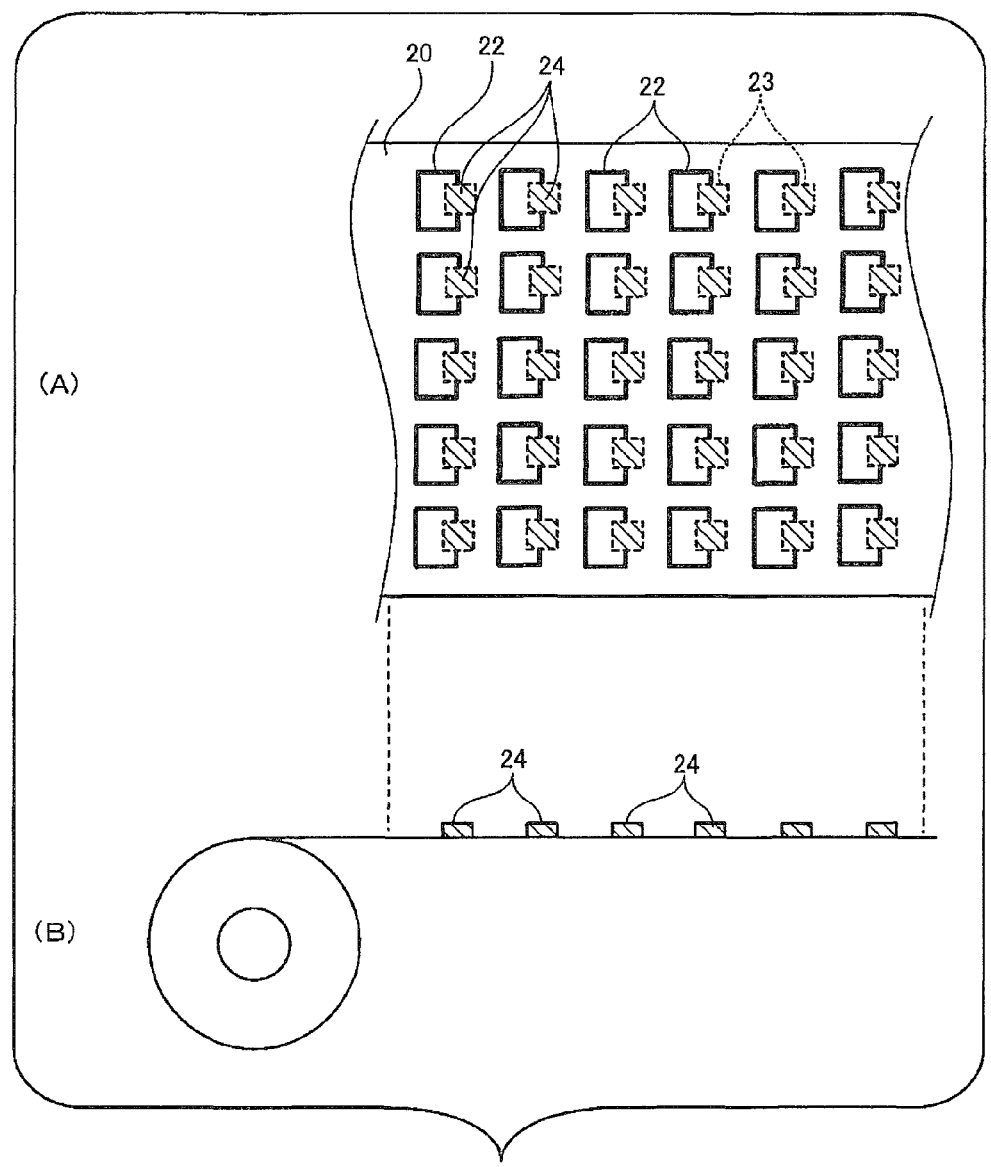
FIG. 27 is a diagram showing a web to which adhesive is supplied.

FIG. 27 is a diagram showing a web to which adhesive is supplied.

The circuit chips aligned on the alignment mask 30 are supplied onto the web 20 at one time after being lifted at one time as shown in FIGS. 25 and 26. However, prior to the supply of circuit chips onto the web 20, an adhesive 24 is coated or disposed by printing on the regions 23 of the web 20 where the circuit chips are to be mounted as shown in FIG. 27.

Figure 28:
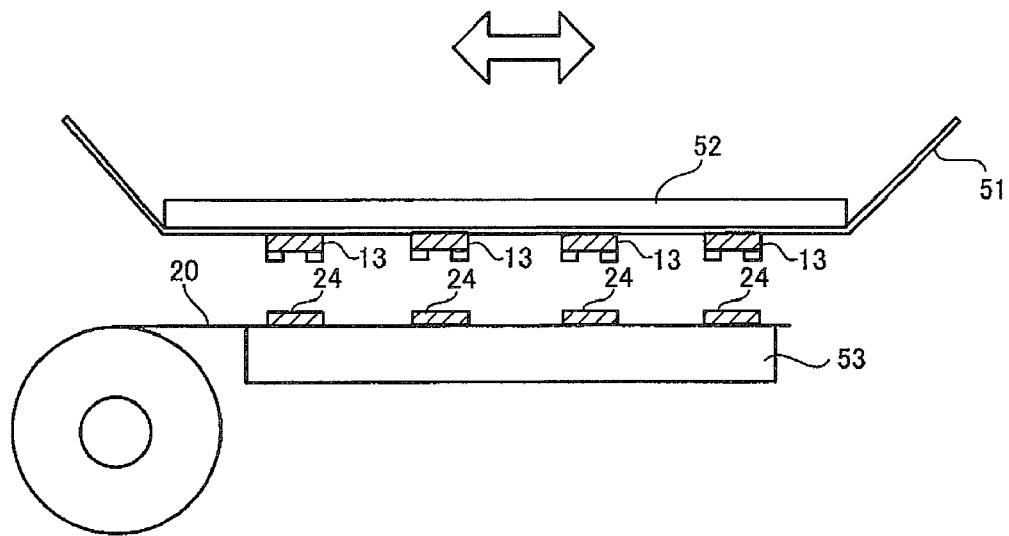
FIG. 28 is a diagram showing a state in which the circuit chips lifted from the alignment mask at one time as shown in FIG. 26 are supplied onto the web at one time.
Figure 29:
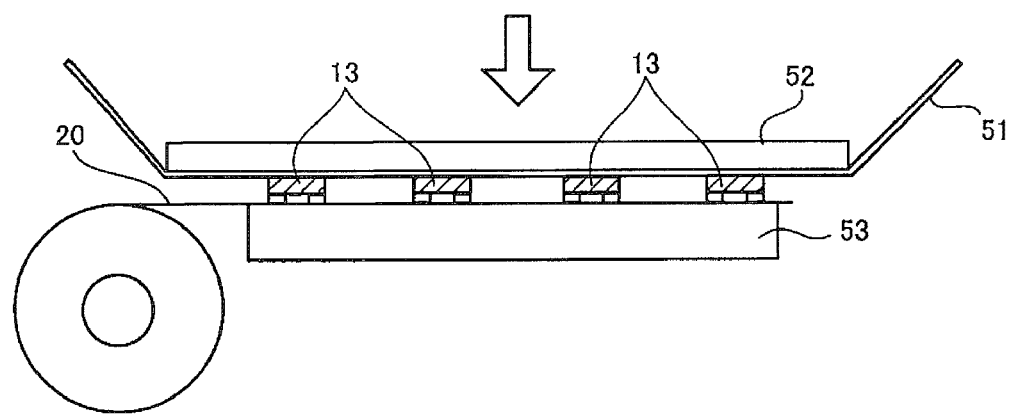
FIG. 29 is a diagram showing a state in which the circuit chips lifted from the alignment mask at one time as shown in FIG. 26 are supplied onto the web at one time.
Figure 30:
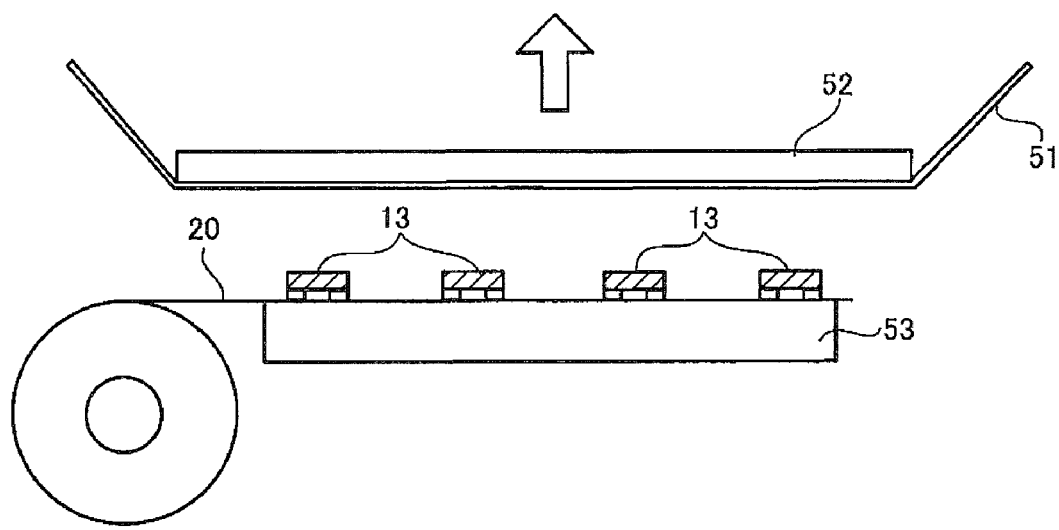
FIG. 30 is a diagram showing a state in which the circuit chips lifted from the alignment mask at one time as shown in FIG. 26 are supplied onto the web at one time.

FIGS. 28 to 30 are diagrams each showing a state in which the circuit chips lifted from the alignment mask 30 at one time as shown in FIG. 26 are supplied onto the web at one time.

A section of the web 20 where the circuit chips 13 are to be supplied is placed on a stage 53, the circuit chips 13 are conveyed to a position above the stage 53 such that the circuit chips 13 are aligned to be correctly overlapped with the chip mounting regions 23 on the web 20 (see FIGS. 15 and 27) as shown in FIG. 28, and the circuit chips 13 are pressed onto the web 20 at one time as shown in FIG. 29. After that, when the adhesive film 51 is lifted as shown in FIG. 30, the circuit chips 13 remain mounted on the web 20. As the adhesive 24 to be supplied onto the web 20 (see FIG. 27), there is used an adhesive having adhesion sufficiently stronger than that of the adhesive film 51 to prevent the circuit chips 13 from being lifted by being adhered to the adhesive film 51, and to prevent the positions of the circuit chips 13 from being shifted when the adhesive film 51 is lifted.

Figure 31:
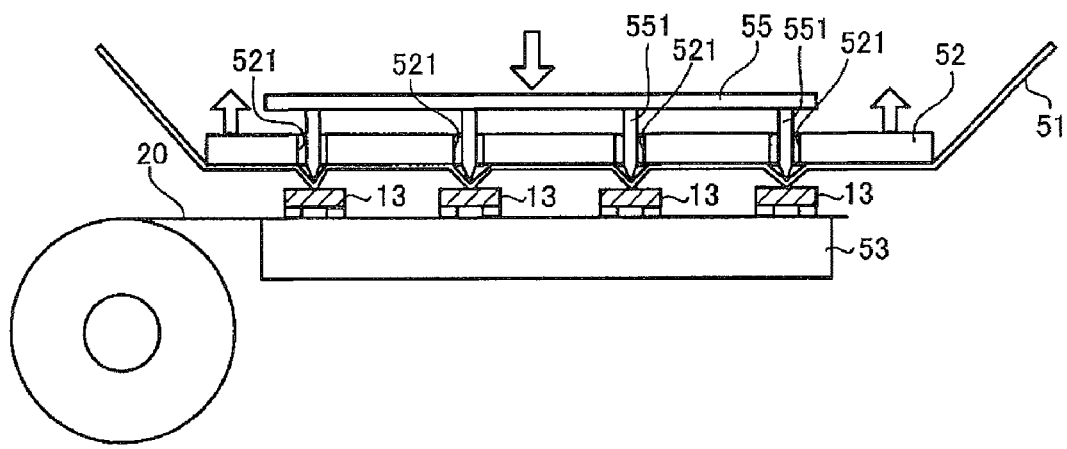
FIG. 31 is a diagram showing a more reliable method for mounting circuit chips onto the web.

FIG. 31 is a diagram showing a more reliable method for mounting circuit chips onto the web.

A press plate having pin insertion holes 521 with the same array pitch as that of the circuit chip 13 is used here as the press plate 52. At the time of lifting the adhesive film 51 after the circuit chips 13 are supplied onto the web 20, press pins 551 of a press pin mechanism 55, which are arranged with the same pitch as that of the pin insertion holes 521 of the press plate 52, are inserted into the pin insertion holes 521, and the adhesive film 51 is lifted while the circuit chips 13 are pressed from above. In this way, it is possible to mount the circuit chips 13 on the web 20 more reliably.

Figure 32:
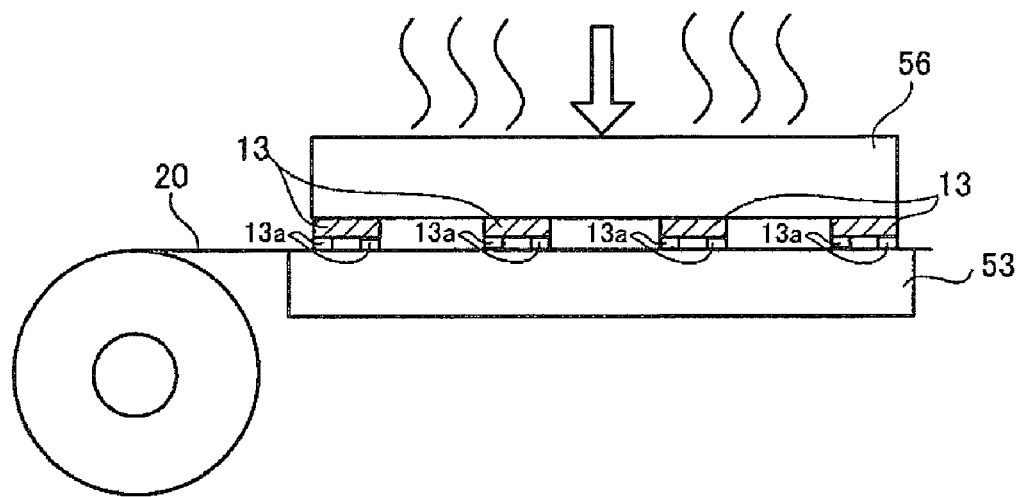
FIG. 32 is a diagram showing a state of mounting the circuit chips supplied on the web.
Figure 33:
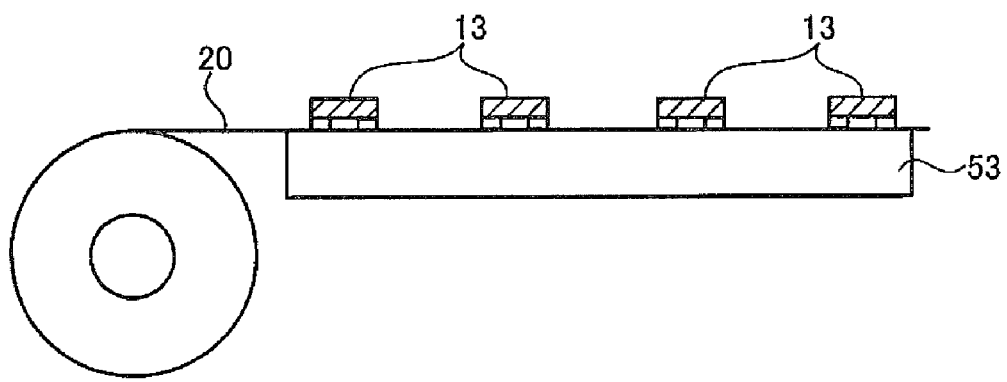
FIG. 33 is a diagram showing a web in a state in which the mounting of the circuit chips is completed.

FIG. 32 is a diagram showing a state of mounting the circuit chips 13 supplied on the web 20, and FIG. 33 is a diagram showing the web 20 in a state that the mounting of the circuit chips 13 is completed.

As mentioned above, the soldering ball (not shown) is fixed onto the terminal 13a of the circuit chip 13. In this case, a pressuring and heating head 56 is pressed onto the circuit chips 13 supplied onto the web 20 at one time to perform pressuring and heating, thereby mounting of the circuit chips 13 on the web 20 is completed as shown in FIG. 33.

After mounting of the circuit chips 13 on the web 20 is completed, the result is cut into individual pieces as RFID tags.

An explanation will be next given of another embodiment of the RFID tag manufacturing method. Regarding the same process as that of the foregoing embodiment, the illustration and explanation will be omitted.

Figure 34:
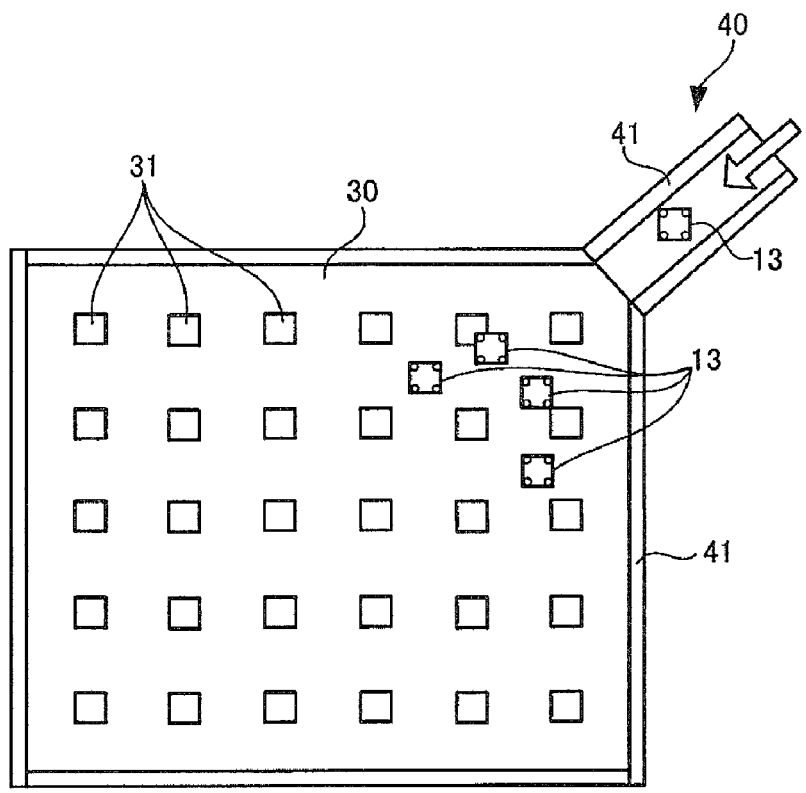
FIG. 34 is a plan view showing a state of supply of circuit chips onto the alignment mask.
Figure 35:
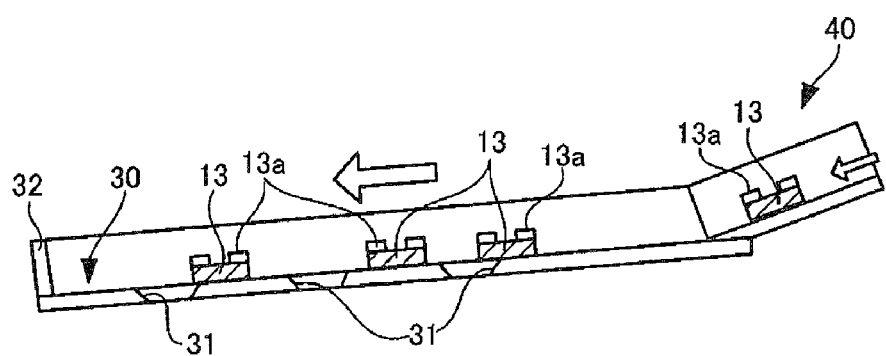
FIG. 35 is a cross-sectional view showing a state of supply of circuit chips onto the alignment mask.

FIGS. 34 and 35 are a plan view and a cross-sectional view each showing a state of supply of circuit chips 13 onto the alignment mask 30.

In these figures, the circuit chips 13 are supplied with the terminals 13a directed upward. As explained with reference to FIGS. 21 and 22, the alignment mask 30 is oscillated or inclined in various directions to align the circuit chips 13 on the alignment mask 30 after being supplied onto the alignment mask 30. Illustration of this point is omitted here.

Figure 36:
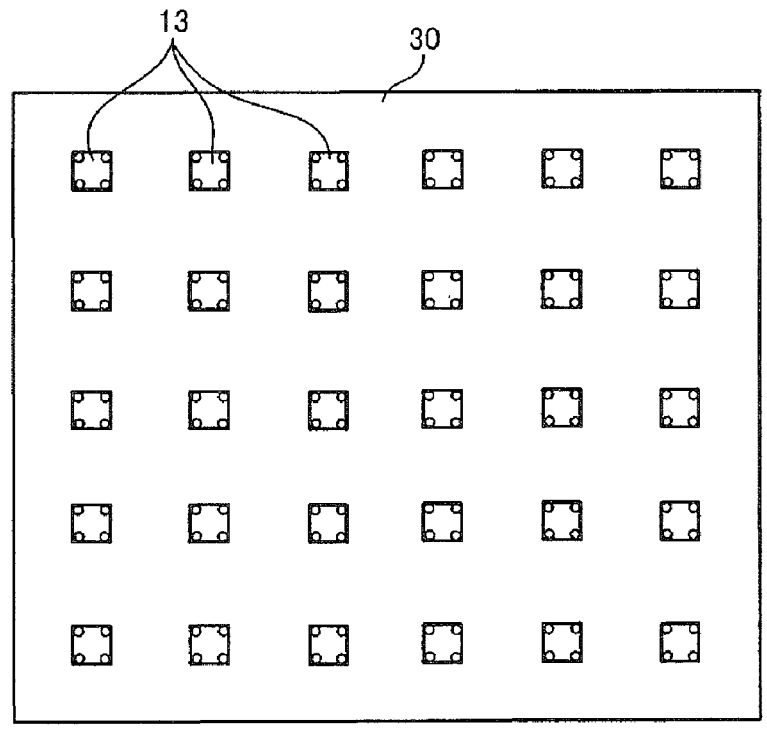
FIG. 36 is a plan view showing a state in which the circuit chips are aligned on the alignment mask.
Figure 37:
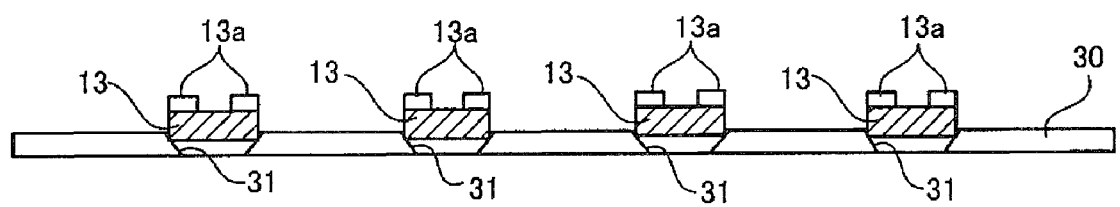
FIG. 37 is a cross-sectional view showing a state in which the circuit chips are aligned on the alignment mask.

FIGS. 36 and 37 are a plan view and a cross-sectional view each showing a state in which the circuit chips 13 are aligned on the alignment mask 30.

In these figures, the circuit chips 13 are aligned on the chip alignment holes 31 of the alignment mask 30 with the terminals 13a directed upward.

Figure 38:
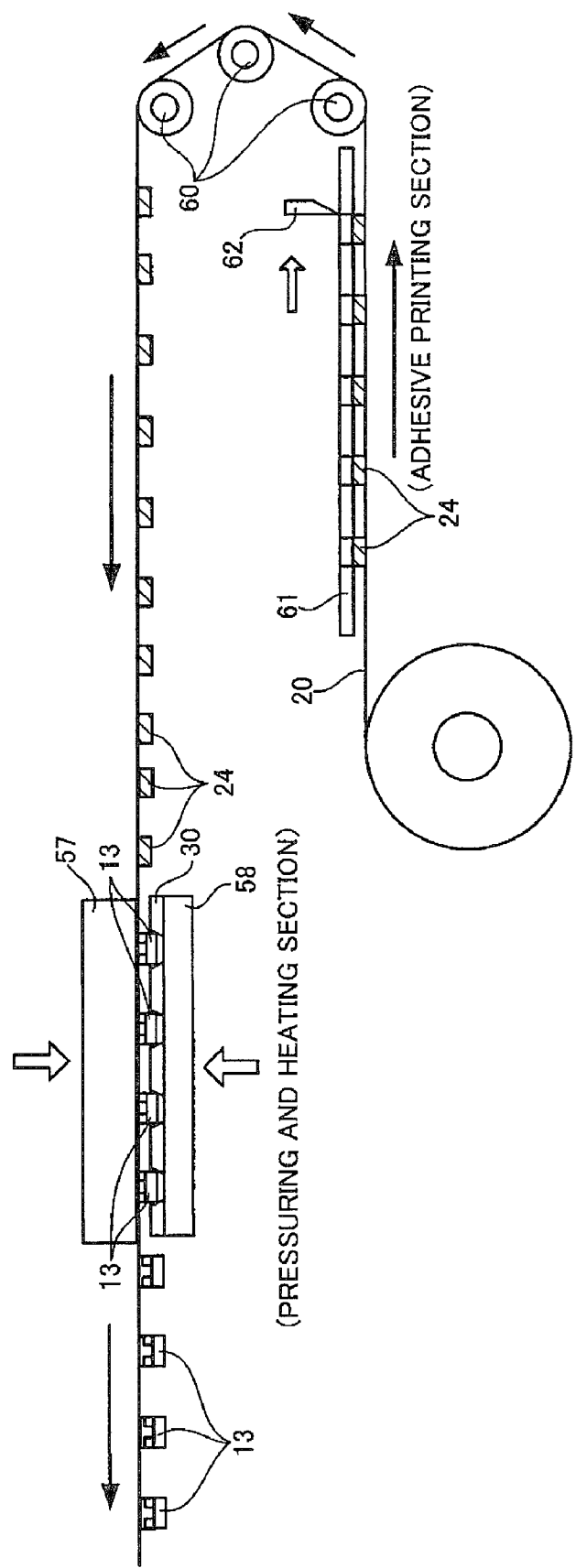
FIG. 38 is a diagram showing a mounting process of circuit chips onto the web.

FIG. 38 is a diagram showing a mounting process of circuit chips 13 onto the web.

The rolled web 20 where the wiring patterns are two-dimensionally arrayed to function as an antenna after manufacturing is unrolled from the rolled state and is first supplied to an adhesive printing section. In the adhesive printing section, the adhesive 24 is printed on the circuit chip mounting regions on the web 20 using a printing mask 61 and a squeegee 62. The web 20 with the adhesive printed is turned upside down by guide members 60.

Figure 39:
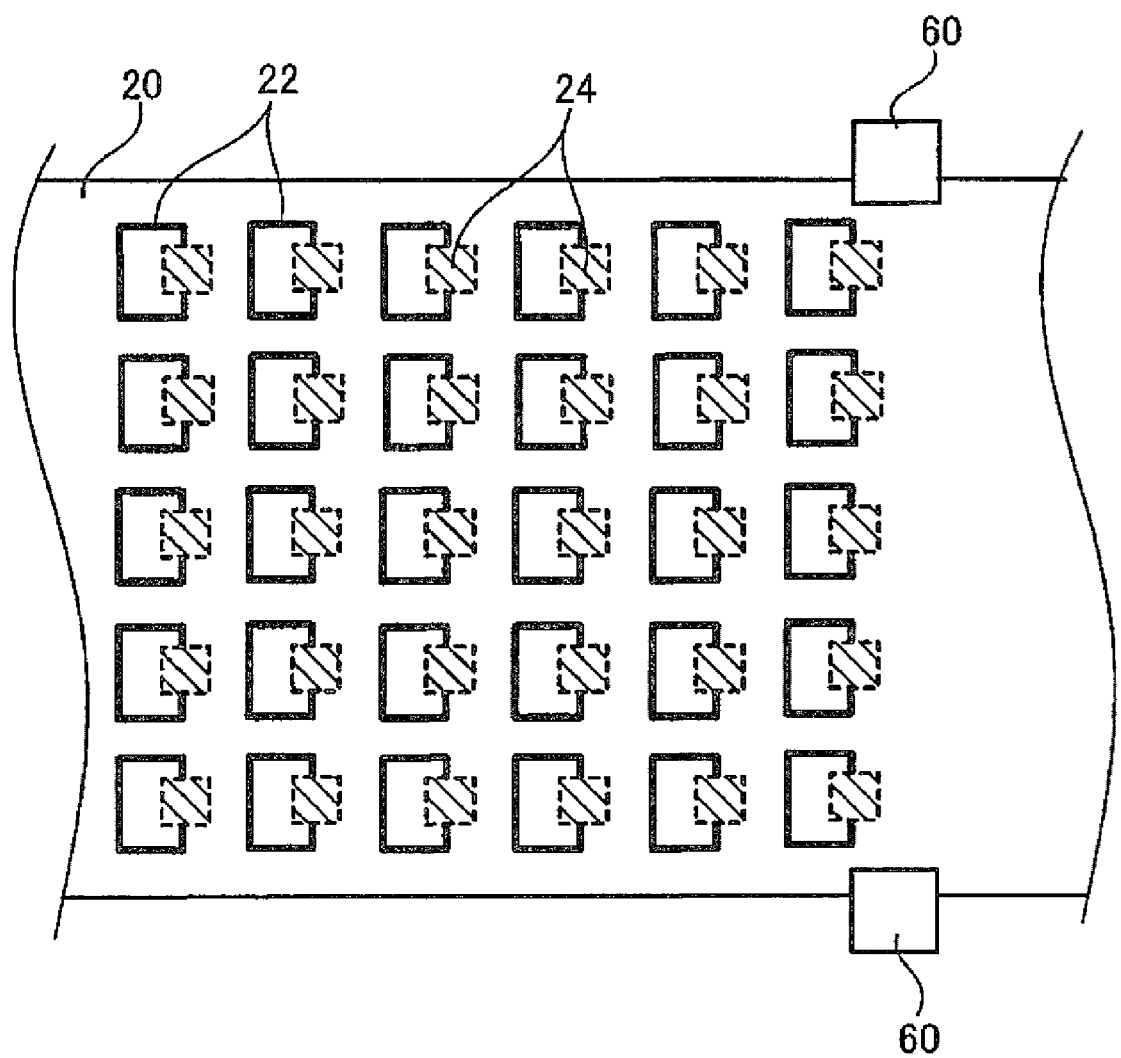
FIG. 39 is a diagram showing a positional relationship between the web and guide members.

FIG. 39 is a diagram showing a positional relationship between the web 20 and the guide members 60.

The web 20 with the wiring patterns 22 formed and the adhesive 24 printed is guided by the guide members 60. However, the guide members 60 guide the web 20 while being in contact with only both edge sections of the web 20 having neither wiring patterns 22 nor the adhesive 24. The guide member 60 may be a fixing member subjected to mirror surface treatment such that no damage to the web 20 is caused, may be a roll whose central section is formed to have a small diameter in such a way to come in contact with only both edge sections of the web 20, or may be a pair of short-length rolls each being provided to each of both edge sections.

Referring back to FIG. 38, explanation will be continued.

The web 20 turned upside down by the guide members 60 next moves to the pressuring and heating section. This pressuring and heating section is provided with a pair of pressuring and heating heads 57 and 58 that pressurize and heat the web 20 while holding the same therebetween. Here, the circuit chips 13 aligned on the alignment mask 30 are disposed under the web 20 and lifted with the alignment mask 30, and then pressurized and heated directly, so that the circuit chips 13 are soldered to the wiring patterns of the web 20.

Thus, numerous circuit chips 13 are mounted on the web 20 at one time.

What is claimed is:

1. An RFID tag comprising:

a base;

a communication antenna which is wired on the base, the communication antenna including four mounting pads each arranged at a position corresponding to each of four corners of a square of which two first mounting pads arranged at diagonal positions respectively are connected with each other by a connecting section extending between two second mounting pads except the two first mounting pads of the four mounting pads; and a circuit chip including two antenna terminals and two dummy terminals, said antenna terminals electrically connected to said mounting pads, said antenna terminals and said dummy terminals line-symmetrically provided on the circuit chip, wherein one of said antenna terminals and one of said dummy terminals are mounted on said two second mounting pads, respectively.

2. The RFID tag according to claim 1, wherein the two second mounting pads are connected with each other via a route bypassing the two first mounting pads and the connecting section.

\* \* \* \* \*